United States Patent
Nakashima et al.

(10) Patent No.: US 7,821,042 B2
(45) Date of Patent: Oct. 26, 2010

(54) IMAGING DEVICE INCLUDING A MULTIPLIER ELECTRODE

(75) Inventors: Hayato Nakashima, Anpachi-gun (JP); Ryu Shimizu, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 612 days.

(21) Appl. No.: 11/831,356

(22) Filed: Jul. 31, 2007

(65) Prior Publication Data

US 2008/0048212 A1 Feb. 28, 2008

(30) Foreign Application Priority Data

Jul. 31, 2006 (JP) ............................. 2006-207359
Jul. 19, 2007 (JP) ............................. 2007-188088

(51) Int. Cl.
*H01L 29/768* (2006.01)
*H01L 27/148* (2006.01)
*H01L 29/66* (2006.01)

(52) U.S. Cl. ...................... 257/217; 257/223; 257/229; 257/246; 257/E23.154; 257/E29.231; 377/60

(58) Field of Classification Search ................. 257/221, 257/236, 248, 217, 223, 229, 246, E27.154
See application file for complete search history.

(56) References Cited

U.S. PATENT DOCUMENTS

| | | | | |
|---|---|---|---|---|
| 4,032,767 A | * | 6/1977 | Lagnado | 708/835 |
| 4,159,430 A | * | 6/1979 | Boudewijns et al. | 365/183 |
| 4,280,141 A | * | 7/1981 | McCann et al. | 348/295 |
| 4,366,550 A | * | 12/1982 | Lampe | 708/838 |
| 4,621,369 A | * | 11/1986 | Narabu et al. | 377/60 |
| 4,819,067 A | * | 4/1989 | Berger et al. | 355/24 |
| 5,337,340 A | * | 8/1994 | Hynecek | 377/60 |
| 6,862,333 B2 | * | 3/2005 | Kashima et al. | 377/60 |
| 7,485,840 B2 | * | 2/2009 | Lazovsky | 250/214.1 |

(Continued)

FOREIGN PATENT DOCUMENTS

JP 7-176721 7/1995
JP 3483261 10/2003

OTHER PUBLICATIONS

Sudhir K. Madan, et al., "Experimental Observation of Avalanche Multiplication in Charge-Coupled Devices," IEEE Transactions on Electron Devices, Jun. 1983, pp. 694-699, vol. ED-30, No. 6.
"680×500 Pixel Impactron™ Primary Color CCD Image Sensor," Texas Instruments, Dec. 2004, Revised Mar. 2005, pp. 1-26, TC246RGB-B0.

*Primary Examiner*—Mary Wilczewski
*Assistant Examiner*—Tsz K Chiu
(74) *Attorney, Agent, or Firm*—Ditthavong, Mori & Steiner, P.C.

(57) ABSTRACT

An imaging device includes a first electrode for generating an electric field storing signal charges, a charge multiplication section for multiplying the stored signal charges, a second electrode for generating the electric field in the charge multiplication section, a voltage conversion portion for converting the signal charges into a voltage, a third electrode for transferring the signal charges to the voltage conversion portion, provided between the first electrode and the voltage conversion portion, wherein the second electrode is provided on a side opposite to the third electrode and the voltage conversion portion with respect to the first electrode.

17 Claims, 13 Drawing Sheets

U.S. PATENT DOCUMENTS 7,619,196 B2 * 11/2009 Oda .................. 250/208.1
2003/0223531 A1 * 12/2003 Kashima et al. ............ 377/57
2008/0179495 A1 * 7/2008 Shimizu et al. .......... 250/208.1
2009/0152605 A1 * 6/2009 Ohno et al. ................ 257/294

* cited by examiner

IMAGING DEVICE INCLUDING A MULTIPLIER ELECTRODE

BACKGROUND OF THE INVENTION

Field of the Invention

The present invention relates to an imaging device comprising a charge multiplication section for multiplying signal charges.

CROSS-REFERENCE TO RELATED APPLICATIONS

The priority application numbers JP2006-207359, Imaging Device, Jul. 31, 2006, Hayato Nakashima, JP2007-188088, Imaging Device, Jul. 19, 2007, Hayato Nakashima and Ryu Shimizu, upon which this patent application is based are hereby incorporated by reference.

DESCRIPTION OF THE BACKGROUND ART

A CCD (Charge Coupled Device) image sensor (imaging device) comprising a multiplier section (charge multiplication section) for multiplying electrons (signal charge) is known in general. In this conventional CCD image sensor, a gate oxide 102 is formed on a surface of a silicon substrate 101 as shown in FIG. 17. Four gate electrodes 103 to 106 are formed on prescribed regions on an upper surface of the gate oxide 102 at prescribed intervals. The CCD image sensor is so formed that four-phase clock signals Φ11 to Φ14 are supplied to the gate electrodes 103 to 106.

A pixel separation barrier, a temporary storage well, a charge transfer barrier and a charge accumulation well are formed in a transfer channel 107 located under the gate electrodes 103 to 106, respectively. This pixel separation barrier has a function of separating the temporary storage well and the charge accumulation well of an adjacent pixel and transferring electrons in the charge accumulation well of the adjacent pixel to the temporary storage well. The temporary storage well has a function of temporarily storing electrons when the electrons are transferred. The charge transfer barrier has a function of separating the temporary storage well and the charge accumulation well and transferring electrons stored in the temporary storage well to the charge accumulation well.

The charge accumulation well has a function of storing electrons transferred from the temporary storage well and also has a function as a multiplier section for multiplying electrons due to impact ionization by an electric field. In other words, a high electric field region 108 adjusted to a high potential is formed in an interface between the charge transfer barrier and the charge accumulation well, whereby the electrons transferred to the high electric field region 108 obtain energy from the high electric field region 108. Then, the electrons having obtained the energy collide with atoms of the silicon substrate 101 during movement in the high electric field region 108, and electrons and holes are generated by this impact. Among the generated electrons and holes, only the electrons are accumulated in the charge accumulation well by the electric field in the high electric field region 108. Thus, the electrons are multiplied. The multiplication of the electrons is performed in a process of transferring electrons generated by a photodiode of a photodetection region.

A multiplication operation of the conventional CCD image sensor will be now described with reference to FIG. 17.

The clock signal Φ11 is supplied to the gate electrode 103 to bring the gate electrode 103 into an ON-state, and the gate electrode 106 of the adjacent pixel is turned off after the lapse of a prescribed period of time after the clock signal Φ11 is supplied to the gate electrode 103. Thus, the electrons stored in the charge accumulation well of the adjacent pixel are transferred to the pixel separation barrier.

The clock signal Φ12 is supplied to the gate electrode 104 to bring the gate electrode 104 into an ON-state, and the gate electrode 103 is turned off. Thus, the electrons transferred to the pixel separation barrier are transferred to the temporary storage well.

Then, the clock signal Φ14 is supplied to the gate electrode 106 to bring the gate electrode 106 into an ON-state. Thus, a high voltage is applied to the gate electrode 106, and the high electric field region 108 is formed in the interface between the charge transfer barrier and the charge accumulation well. After that, while the gate electrode 106 remains in the ON-state, the gate electrode 104 is turned off, whereby the electrons stored in the temporary storage well are transferred to the charge accumulation well over the charge transfer barrier. Thus, the transferred electrons are multiplied due to impact ionization by a high electric field, and the multiplied electrons are stored in the charge accumulation well. The clock signal Φ13 does not supplied to the gate electrode 105 and the gate electrode 105 on a constant basis is maintained in an OFF-state.

When a structure of the conventional CCD image sensor shown in FIG. 17 is applied to a CMOS image sensor, however, the gate electrode corresponding to the charge accumulation well is turned off when the electrons stored in the charge accumulation well are transferred to a floating diffusion region in order to read data. At this time, the high voltage clock signal supplied to the gate electrode corresponding to the charge accumulation well is stepped down, and hence the potential of an electron transfer region corresponding to this gate electrode (charge accumulation well) is greatly changed. Thus, the great change in the potential of the electron transfer region corresponding to this gate electrode (charge accumulation well) transmits to the electron transfer region corresponding to a gate electrode for reading data, adjacent to this gate electrode, thereby disadvantageously changing the potential of the electron transfer region corresponding to the gate electrode for reading data. Consequently, the number of electrons transferred from the charge accumulation well to the floating diffusion region varies, whereby correct read of data is disadvantageously difficult.

SUMMARY OF THE INVENTION

An imaging device according to a first aspect of the present invention comprises a storage portion for storing and transferring signal charges, a first electrode for generating an electric field storing the signal charges in the storage portion, a charge multiplication section for multiplying the signal charges stored in the storage portion due to impact ionization, a second electrode for generating the electric field for impact ionizing the signal charges in the charge multiplication section, a voltage conversion portion for converting the signal charges into a voltage and a third electrode for transferring the signal charges from the storage portion to the voltage conversion portion, provided between the first electrode and the voltage conversion portion, wherein the second electrode is provided on a side opposite to the third electrode and the voltage conversion portion with respect to the first electrode. The signal charges in the present invention mean electrons or holes.

An imaging device according to a second aspect of the present invention comprises storage means for storing and transferring the signal charges, a first electrode for generating an electric field storing the signal charges in the storage means, charge multiplication means for multiplying the signal charges stored in the storage means due to impact ionization, a second electrode for generating the electric field for impact ionizing the signal charges in the charge multiplication means, voltage conversion means for converting the signal charges into a voltage and a third electrode for transferring the signal charges from the storage means to the voltage conversion means, provided between the first electrode and the voltage conversion means, wherein the second electrode is provided on a side opposite to the third electrode and the voltage conversion means with respect to the first electrode. The signal charges in the present invention mean electrons or holes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of a CMOS image sensor according to a first embodiment will be now described with reference to FIGS. 1 to 5. In the first embodiment, the present invention is applied to a passive CMOS image sensor, which is an exemplary imaging device.

Figure 1:
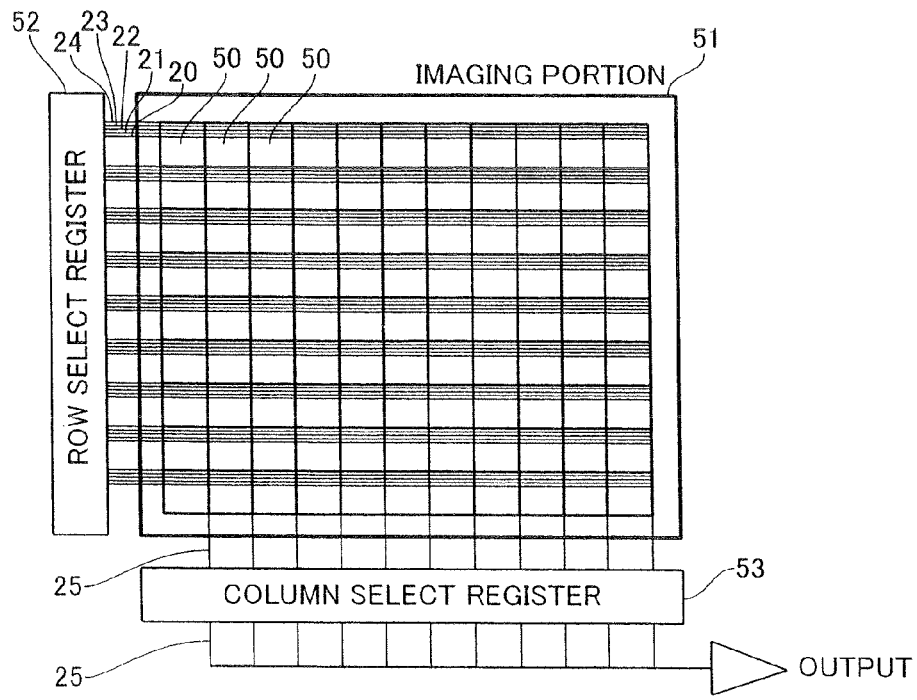
FIG. 1 is a plan view showing an overall structure of a CMOS image sensor according to a first embodiment of the present invention.

The CMOS image sensor according to the first embodiment comprises an imaging portion 51 including a plurality of pixels 50 arranged in the form of matrix, a row select register 52 and a column select register 53 as shown in FIG. 1.

Figure 2:
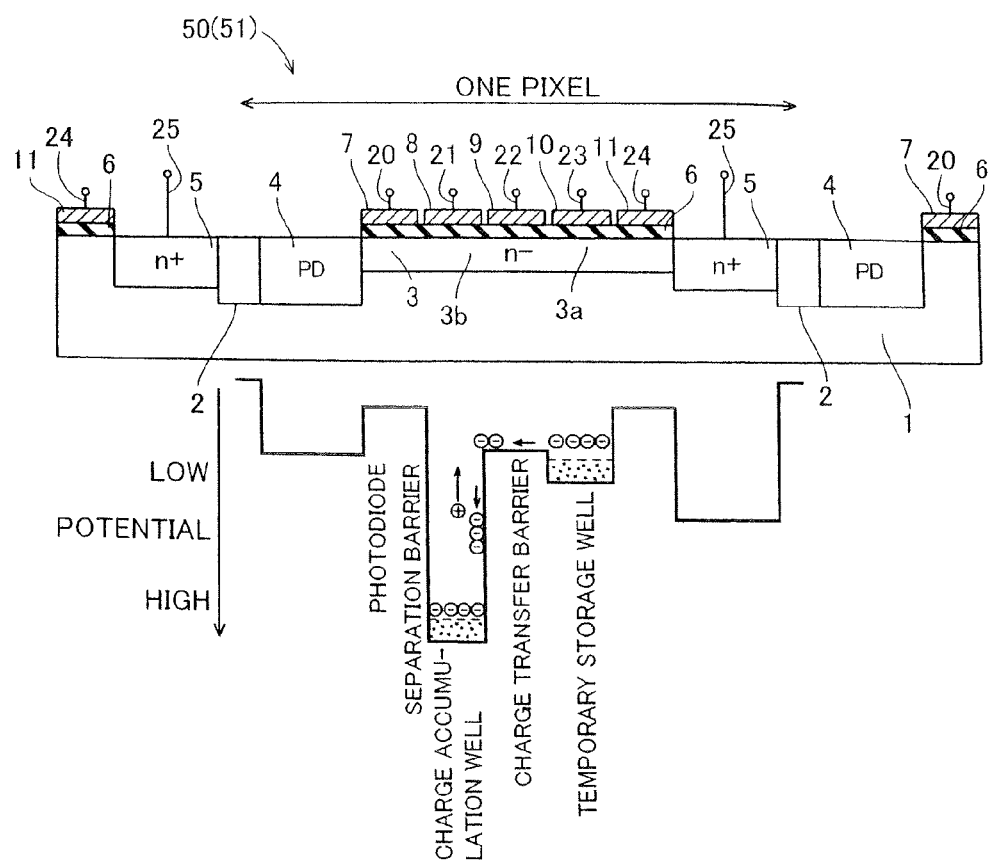
FIGS. 2 and 3 are sectional views showing the structure of the CMOS image sensor according to the first embodiment shown in FIG. 1.
Figure 3:
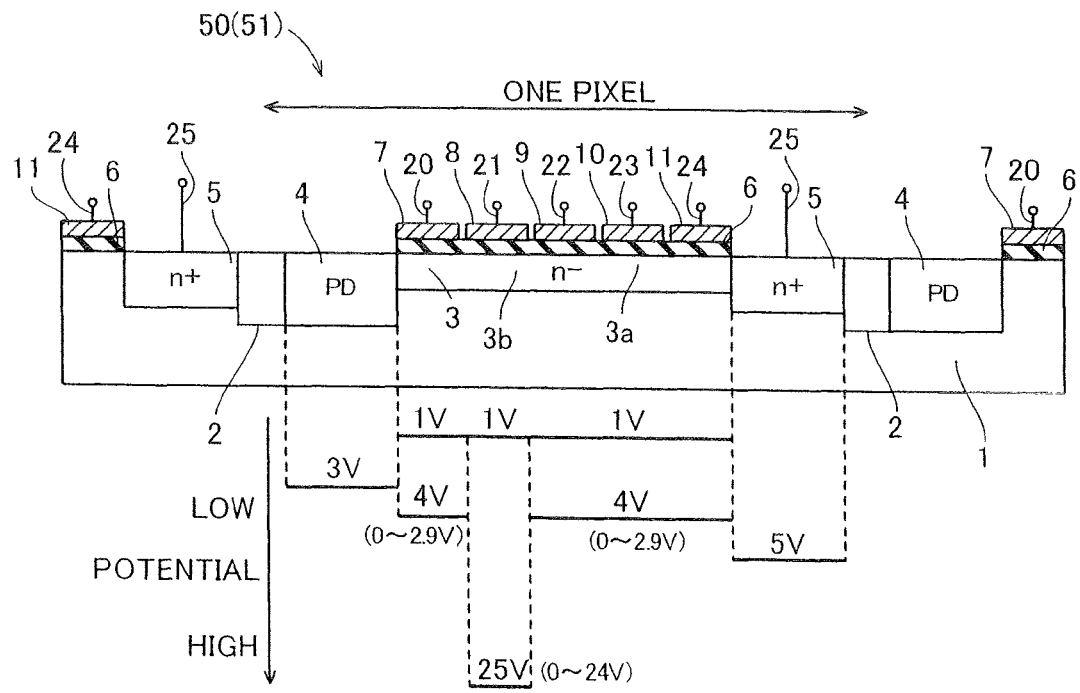

As shown in FIGS. 2 and 3, in a cross-sectional structure of the pixels 50 of the CMOS image sensor according to the first embodiment, element separation regions 2 are formed on a surface of a p-type silicon substrate 1 for separating the pixels 50 respectively. A photodiode portion (PD) 4 and a floating diffusion region 5 consisting of an $n^+$-type impurity region is so formed on a surface of a p-type silicon substrate 1 of each pixel 50 surrounded by the element separation regions 2 as to hold a transfer channel 3 consisting of an $n^-$-type impurity region therebetween at prescribed intervals. The transfer channel 3 is an example of the "signal charge transfer region" in the present invention, and the photodiode portion 4 is an example of the "photoelectric conversion portion" in the present invention. The floating diffusion region 5 is an example of the "voltage conversion portion" or the "voltage conversion means" in the present invention.

Each photodiode portion 4 has a function of generating electrons in accordance with an amount of incident light and storing the generated electrons. The photodiode portion 4 is so formed as to be adjacent to the element separation region 2 and the transfer channel 3. Each floating diffusion region 5 has an impurity concentration ($n^+$) higher than the impurity concentration ($n^-$) of the transfer channel 3. The floating diffusion region 5 has a function of holding signal charges by transferred electrons and converting the signal charge into a voltage. The floating diffusion region 5 is so formed as to be adjacent to the element separation region 2 and the transfer channel 3. Thus, the floating diffusion region 5 is so formed as to face the photodiode portion 4 through the transfer channel 3.

According to the first embodiment, a gate insulating film 6 is formed on an upper surface of each transfer channel 3. A transfer gate electrode 7, a multiplication gate electrode 8, a transfer gate electrode 9, a transfer gate electrode 10 and a readout gate electrode 11 are formed on prescribed regions of an upper surface of each gate insulating film 6 at prescribed intervals in this order from a side closer to the photodiode portion 4 to the side closer to the floating diffusion region 5. In other words, each transfer gate electrode 7 is so formed as to be adjacent to the photodiode portion 4. The transfer gate electrode 7 is formed between the photodiode portion 4 and the multiplication gate electrode 8. Each transfer gate electrode 9 is formed between the multiplication gate electrode 8 and the transfer gate electrode 10. Each multiplication gate electrode 8 is formed on a side opposite to the readout gate electrode 11 and the floating diffusion region 5 with respect to the transfer gate electrode 10. Each readout gate electrode 11 is formed between the transfer gate electrode 10 and the floating diffusion region 5. The readout gate electrode 11 is so formed as to be adjacent to the floating diffusion region 5. The transfer gate electrodes 7, 9 and 10 are examples of the "fourth electrode", the "fifth electrode" and "first electrode" in the present invention respectively. The multiplication gate electrode 8 is an example of the "second electrode" in the present invention, and the readout gate electrode 11 is an example of the "third electrode" in the present invention.

Figure 4:
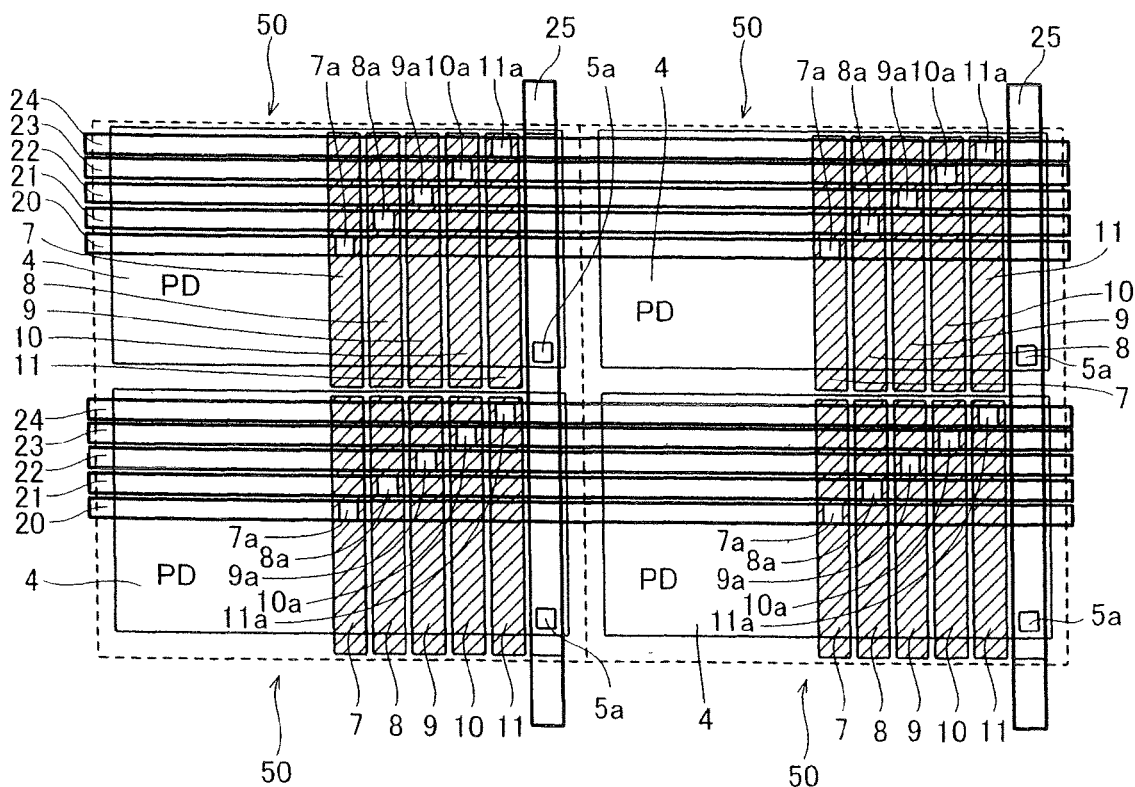
FIG. 4 is a plan view showing pixels of the CMOS image sensor according to the first embodiment shown in FIG. 1.

As shown in FIG. 4, wiring layers 20, 21, 22, 23 and 24 supplying clock signals Φ1, Φ2, Φ3, Φ4 and Φ5 for voltage control are electrically connected to the transfer gate electrodes 7, the multiplication gate electrodes 8, the transfer gate electrodes 9, the transfer gate electrodes 10 and the readout gate electrodes 11 through contact portions 7a, 8a, 9a, 10a and 11a, respectively. The wiring layers 20, 21, 22, 23 and 24 are formed for each row and electrically connected to the transfer gate electrodes 7, the multiplication gate electrodes 8, the transfer gate electrodes 9, the transfer gate electrodes 10 and the readout gate electrodes 11 of the plurality of pixels 50 in each row respectively. Signal lines 25 for extracting a signal are electrically connected to the floating diffusion regions 5 through the contact portions 5a. The signal lines 25 are formed for each column and electrically connected to the floating diffusion regions 5 of the plurality of pixels 50 in each column.

As shown in FIG. 3, when ON signals (high-level signals) of the clock signals Φ1, Φ3, Φ4 and Φ5 are supplied to the transfer gate electrodes 7, 9 and 10 and the readout gate electrodes 11 through the wiring layers 20, 22, 23 and 24 respectively, a voltage of about 2.9 V is applied to the transfer gate electrodes 7, 9 and 10 and the readout gate electrode 11. Thus, when the ON signals (high-level signals) of the clock signals Φ1, Φ3, Φ4 and Φ5 are supplied to the transfer gate electrodes 7, 9 and 10 and the readout gate electrode 11, the transfer channels 3 located under the transfer gate electrodes 7, 9 and 10 and the readout gate electrodes 11 are adjusted to a potential of about 4 V. When OFF signals (low-level signals) of the clock signals Φ1, Φ3, Φ4 and Φ5 are supplied to the transfer gate electrodes 7, 9 and 10 and the readout gate electrodes 11, the transfer channels 3 located under the transfer gate electrodes 7, 9 and 10 and the readout gate electrodes 11 are adjusted to a potential of about 1 V.

When an ON signal (high-level signal) of the clock signal Φ2 is supplied to the multiplication gate electrodes 8 from the wiring layers 21, a voltage of about 24 V is applied to the multiplication gate electrodes 8. Thus, when the ON signal (high-level signal) of the clock signal Φ2 is supplied to the multiplication gate electrodes 8, the transfer channels 3 located under the multiplication gate electrodes 8 are adjusted to a high potential of about 25 V. When an OFF signal (low-level signal) of the clock signal Φ2 is supplied to the multiplication gate electrodes 8, the transfer channels 3 located under the multiplication gate electrode 8 are adjusted to a potential of about 1 V. The photodiode portions 4 and the floating diffusion regions 5 are so formed as to be adjusted to potentials of about 3 V and about 5 V respectively.

Thus, each transfer channel 3 located under the transfer gate electrode 10 (electron storage portion 3a) is so formed that an electric field temporarily storing electrons is formed in the transfer channel 3 located under the transfer gate electrode 10 (electron storage portion (temporary storage well) 3a) when the ON signal (high-level signal) is supplied to the transfer gate electrode 10 as shown in FIG. 2. The electron storage portions 3a is an example of the "storage portion" or "storage means" in the present invention.

Each transfer channel 3 located under the multiplication gate electrode 8 (electron multiplier section 3b) is so formed that a high electric field multiplying electrons by impact ionization is formed in the transfer channel 3 located under the multiplication gate electrode 8 (electron multiplier section (charge accumulation well) 3b) by adjusting the electron multiplier section 3b to a potential of about 25 V when the ON signal (high-level signal) is supplied to the multiplication gate electrode 8. The impact ionization of the electrons occurs in boundaries between the transfer channels 3 located under the multiplication gate electrodes 8 (electron multiplier sections 3b) and the transfer channels 3 located under the transfer gate electrodes 9. The electron multiplier sections 3b is an example of the "charge multiplication section" and "charge multiplication means" in the present invention.

Each transfer channel 3 located under the transfer gate electrode 7 has a function of transferring electrons stored in the photodiode portion 4 to the electron multiplier section 3b when the ON signal (high-level signal) is supplied to the transfer gate electrode 7 and also has a function as a photodiode separation barrier separating the photodiode portion 4 and the electron multiplier section 3b when the OFF signal (low-level signal) is supplied to the transfer gate electrode 7.

Each transfer channel 3 located under the transfer gate electrode 9 has a function of transferring electrons stored in the electron storage portion 3a to the electron multiplier section 3b and transferring electrons stored in the electron multiplier section 3b to the electron storage portion 3a when the ON signal (high-level signal) is supplied to the transfer gate electrode 9. Each transfer channel 3 located under the transfer gate electrode 9 functions as a charge transfer barrier separating the electron storage portion 3a and the electron multiplier section 3b when the OFF signal (low-level signal) is supplied to the transfer gate electrode 9. In other words, the transfer gate electrode 9 is so formed as to be capable of transferring the electrons stored in the electron storage portion 3a to the electron multiplier section 3b and transferring the electrons stored in the electron multiplier sections 3b to the electron storage portion 3a by supplying the ON signal (high-level signal) to the transfer gate electrode 9.

Each transfer channel 3 located under the readout gate electrode 11 has a function of transferring the electrons stored in the electron storage portion 3a to the floating diffusion region 5 when the ON signal (high-level signal) is supplied to the readout gate electrode 11 and also has a function of separating the electron storage portion 3a and the floating diffusion region 5 when the OFF signal (low-level signal) is supplied to the readout gate electrode 11. In other words, each readout gate electrode 11 is so formed as to be capable of transferring the electrons stored in the electron storage portion 3a to the floating diffusion region 5 by supplying the ON signal (high-level signal) to the readout gate electrode 11.

Figure 5:
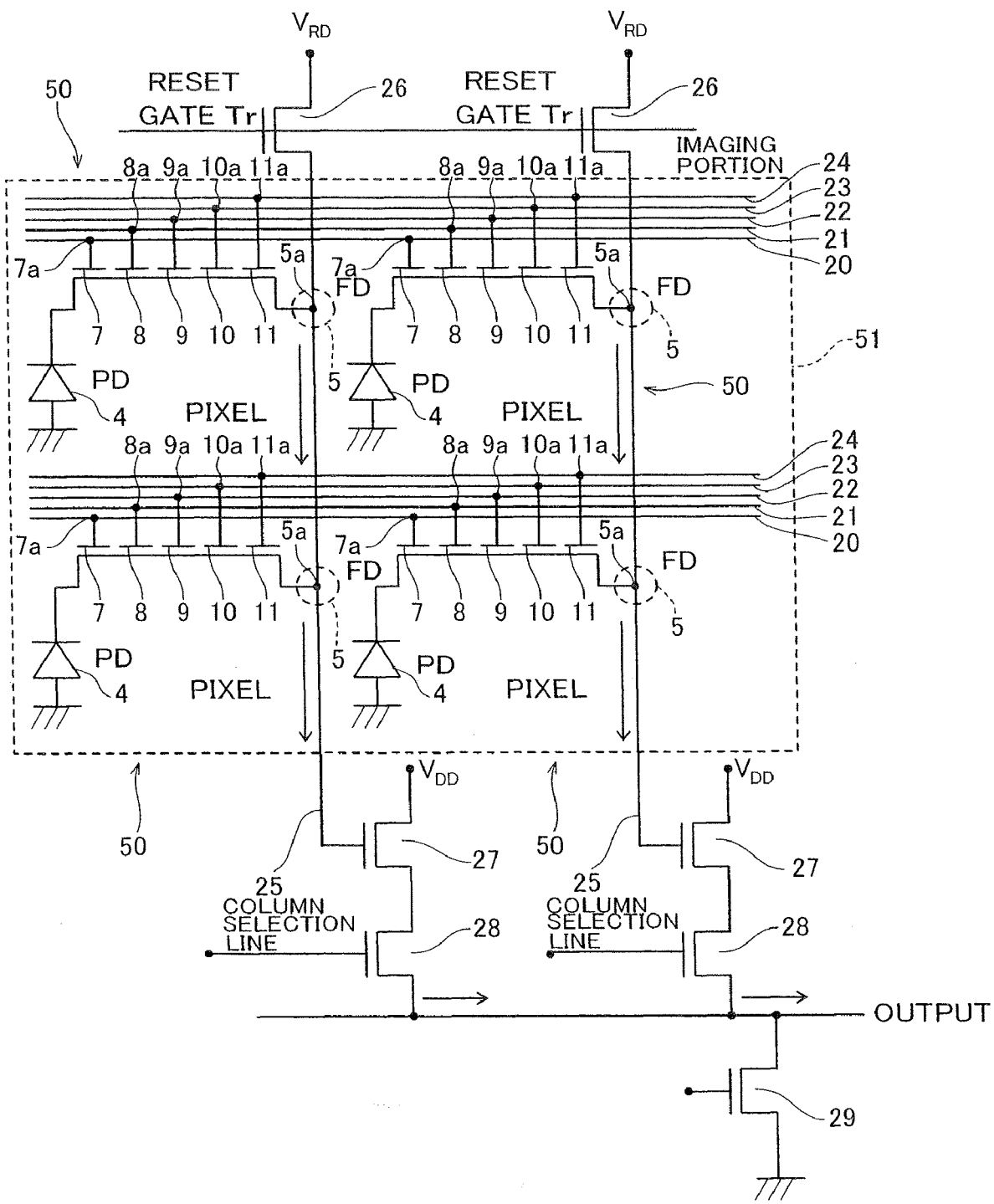
FIG. 5 is a circuit diagram showing a circuit structure of the CMOS image sensor according to the first embodiment shown in FIG. 1.

As shown in FIG. 5, a source of a reset gate transistor 26 is connected to a first end of the signal line 25 in each column. Each reset gate transistor 26 has a gate to which a reset signal is supplied and a drain to which a reset voltage $V_{RD}$ (about 5 V) is applied. Thus, the reset gate transistor 26 has a function of resetting the voltage of the signal line 25 to the reset voltage $V_{RD}$ (about 5 V) after reading data of the pixel 50 and holding the floating diffusion region 5 in an electrically floating state in reading the data of the pixel 50.

A second end of the signal line 25 in each column is connected to a gate of a voltage conversion transistor 27. Each voltage conversion transistor 27 has a source connected to a drain of a selection transistor 28 and a drain to which a power supply voltage $V_{DD}$ is supplied. A column selection line is connected to a gate of each selection transistor 28 and an output line is connected to a source of the selection transistor 28. The output line is connected to a drain of one transistor 29. A source of the transistor 29 is grounded and a prescribed voltage for serving the transistor 29 as a constant current source is applied to a gate of the transistor 29. The voltage conversion transistor 27 in each column and the transistor 29 constitute a source follower circuit.

A readout operation of the CMOS image sensor according to the first embodiment will be now described with reference to FIG. 5.

First, a high-level signal is supplied to a wiring layer 24 in a prescribed row so that the readout gate electrodes 11 of the pixels 50 in one row in the imaging portion 51 are turned on, while a low-level signal is supplied to a wiring layer 23 in a prescribed row so that the transfer gate electrodes 10 of the pixels 50 in one row in the imaging portion 51 are turned off. Thus, the electrons stored in the electron storage portions 3a of the pixels 50 in the one row are read to the corresponding floating diffusion regions 5 of the pixels 50 respectively. Therefore, a potential corresponding to a signal of each pixel 50 in the prescribed row appears in a signal line 25 in each column. In this state, since the selection transistors 28 are in an OFF-state, a current does not flow in the source follower circuits constituted by the voltage conversion transistors 27 and transistor 29.

Then, a high-level signal is sequentially supplied to the column selection lines, whereby the selection transistors 28 are sequentially turned on. Thus, a current is sequentially flows through the voltage conversion transistor 27 and the selection transistor 28 in each column and the transistor 29, whereby a signal for each pixel 50 is outputted in response to an ON-state of each voltage conversion transistor 27 (gate potential of each voltage conversion transistor 27 (potential of each signal line 25). After all outputs are completed, a high-level reset signal is supplied to the gates of the reset gate transistors 26 so that the reset gate transistors 26 are turned on, whereby the potential of the signal lines 25 is reset to about 5 V. The aforementioned operation is repeated, whereby the readout operation of the CMOS image sensor according to the first embodiment is performed.

A transfer operation of electrons of the CMOS image sensor according to the first embodiment will be now described with reference to FIGS. 6 and 7.

Figure 6:
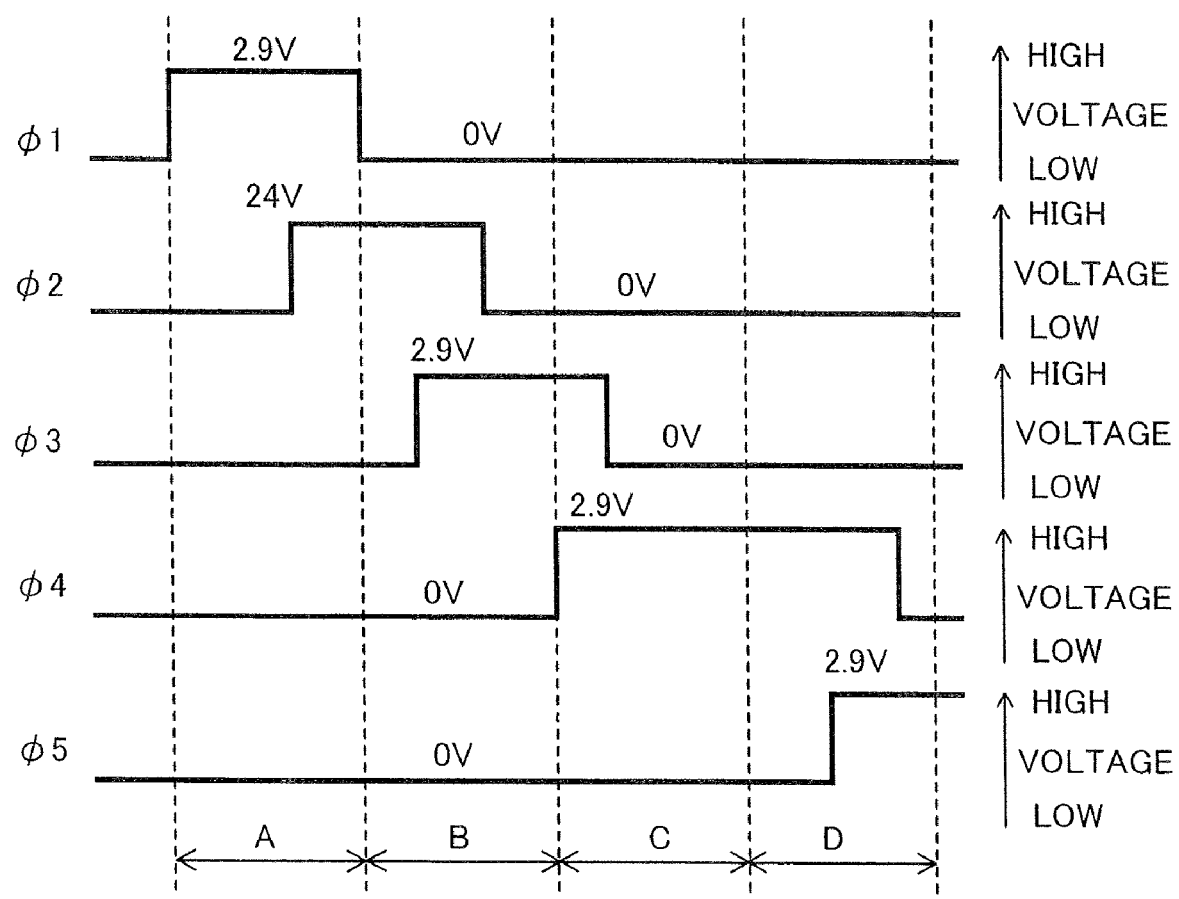
FIG. 6 is a signal waveform diagram for illustrating a transfer operation of electrons in the CMOS image sensor according to the first embodiment of the present invention.
Figure 7:
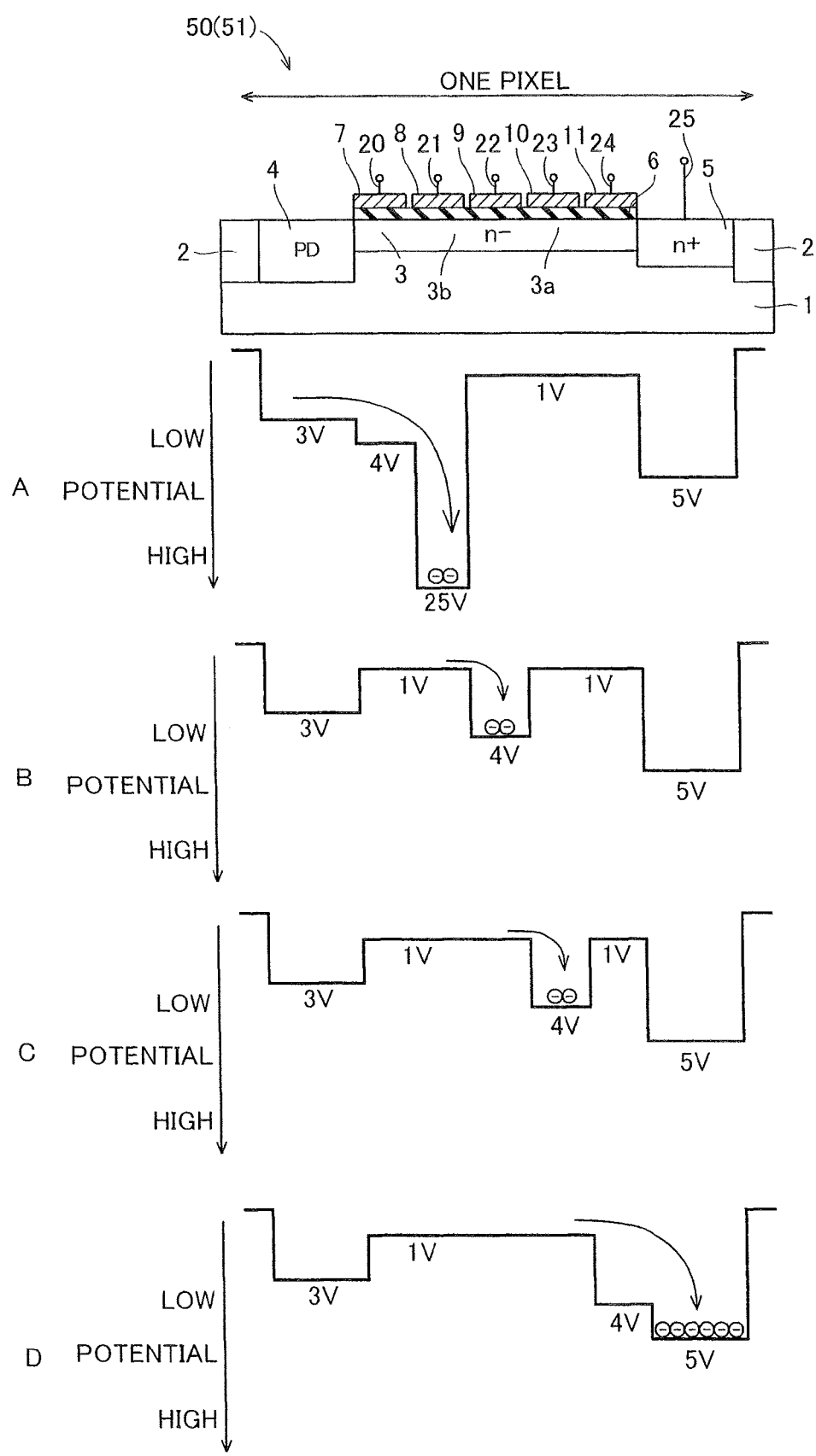
FIG. 7 is a potential diagram for illustrating a transfer operation of electrons in the CMOS image sensor according to the first embodiment of the present invention.

In a period A in FIG. 6, the transfer gate electrodes 7 are turned on, whereby the transfer channels 3 located under the transfer gate electrodes 7 are adjusted to a potential of about 4 V, as shown in FIG. 7. At this time, the photodiode portions 4 are adjusted to a potential of about 3 V, and hence electrons generated by and stored in the photodiode portions 4 are transferred from the photodiode portions 4 to the transfer channels 3 located under the transfer gate electrodes 7. Thereafter the multiplication gate electrodes 8 are turned on, whereby the transfer channels 3 located under the multiplication gate electrodes 8 are adjusted to a potential of about 25 V. At this time, the transfer channels 3 located under the transfer gate electrodes 7 are adjusted to a potential of about 4 V, and hence the electrons transferred to the transfer channels 3 located under the transfer gate electrodes 7 are transferred to the transfer channels 3 located under the multiplication gate electrodes 8. Thereafter the transfer gate electrodes 7 are turned off, whereby the transfer channels 3 located under the transfer gate electrodes 7 are adjusted to a potential of about 1 V.

In a period B in FIG. 6, the transfer gate electrodes 9 are turned on and the multiplication gate electrodes 8 are turned off, whereby the transfer channels 3 located under the transfer gate electrodes 9 are adjusted to a potential of about 4 V and the transfer channels 3 located under the multiplication gate electrodes 8 are adjusted to a potential of about 1 V, as shown in FIG. 7. Thus, the electrons stored in the transfer channels 3 located under the multiplication gate electrodes 8 are transferred to the transfer channels 3 located under the transfer gate electrodes 9 adjusted to a potential (about 4 V) higher than the potential (about 1 V) of the transfer channels 3 located under the multiplication gate electrodes 8.

In a period C in FIG. 6, the transfer gate electrodes 10 are turned on and the transfer gate electrodes 9 are turned off, whereby the transfer channels 3 located under the transfer gate electrodes 10 are adjusted to a potential of about 4 V and the transfer channels 3 located under the transfer gate electrodes 9 are adjusted to a potential of about 1 V, as shown in FIG. 7. Thus, the electrons transferred to the transfer channels 3 located under the transfer gate electrodes 9 are transferred to the transfer channels 3 located under the transfer gate electrodes 10 adjusted to a potential (about 4 V) higher than the potential (about 1 V) of the transfer channels 3 located under the transfer gate electrodes 9. Thus, the electrons transferred from the photodiode portions 4 are temporarily stored in the transfer channels 3 located under the transfer gate electrodes 10 (electron storage portions (temporary storage wells) 3a). Thereafter a multiplication operation of electrons described later is repeatedly performed a plurality of times (about 400 times, for example). Thus, the electrons transferred from the photodiode portions 4 are multiplied by about 2000 times.

In a period D in FIG. 6, the readout gate electrodes 11 are turned on and the transfer gate electrodes 10 are turned off in a state where the electrons are temporarily stored in the transfer channels 3 located under the transfer gate electrodes 10 (electron storage portions 3a), whereby the transfer channels 3 located under the readout gate electrodes 11 are adjusted to a potential of about 4 V and the transfer channels 3 located under the transfer gate electrodes 10 are adjusted to a potential of about 1 V, as shown in FIG. 7. Thus, the electrons stored in the transfer channels 3 located under the transfer gate electrodes 10 (electron storage portions 3a) are transferred to the floating diffusion regions 5 adjusted to a potential (about 5 V) higher than the potential (about 1 V) of the transfer channels 3 located under the transfer gate electrodes 10 through the transfer channels 3 located under the readout gate electrodes 11 adjusted to a potential of about 4 V.

The multiplication operation of electrons of the CMOS image sensor according to the first embodiment will be now described with reference to FIGS. 8 and 9.

Figure 8:
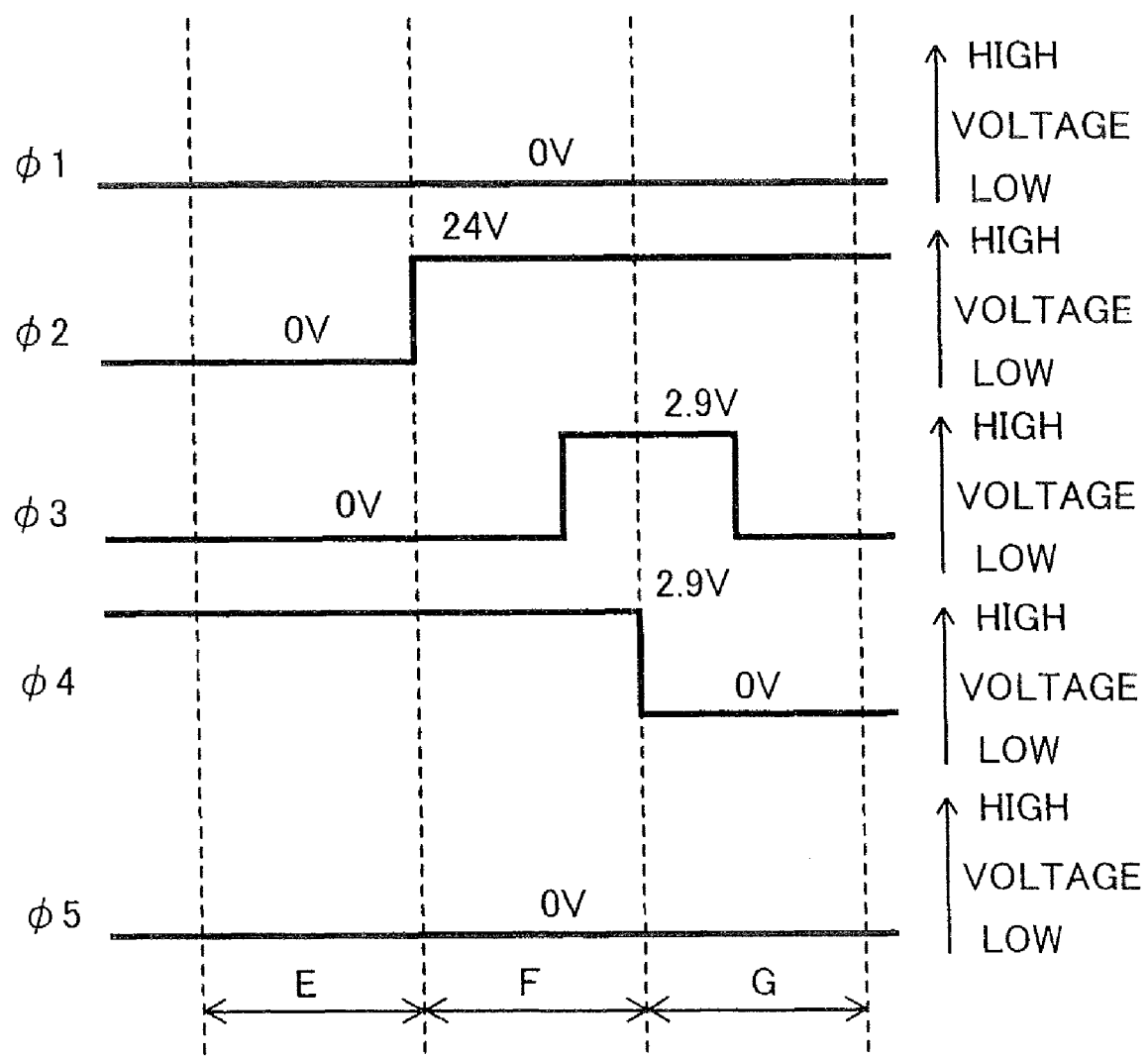
FIG. 8 is a signal waveform diagram for illustrating a multiplication operation of the electrons in the CMOS image sensor according to the first embodiment of the present invention.
Figure 9:
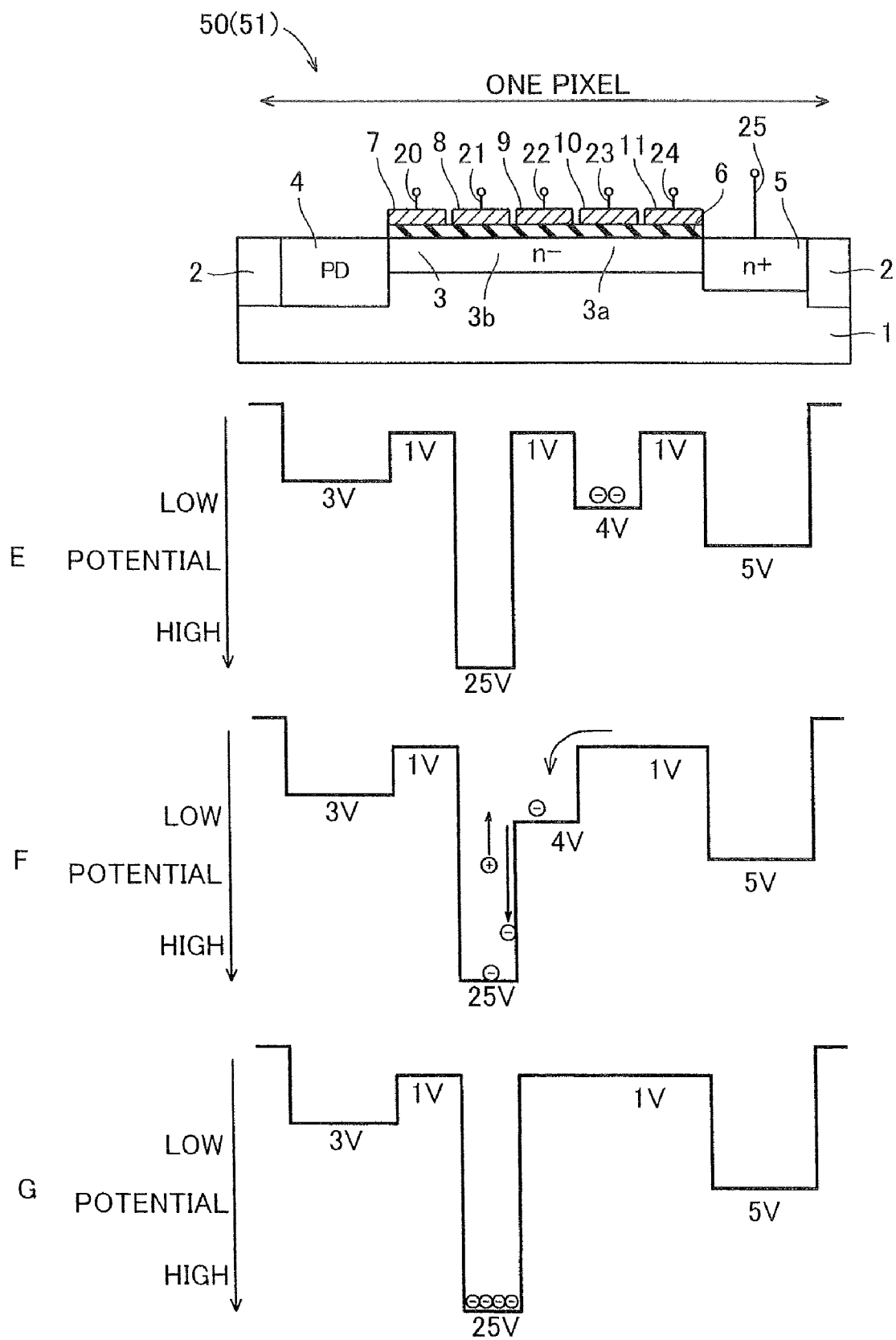
FIG. 9 is a potential diagram for illustrating the multiplication operation of the electrons in the CMOS image sensor according to the first embodiment of the present invention.

First, after the transfer operation in the period C in FIG. 7, in a period E in FIG. 8, the multiplication gate electrodes 8 are turned on in a case where the electrons are stored in the transfer channels 3 located under the transfer gate electrodes 10 (electron storage portions 3a), whereby the transfer channels 3 located under the multiplication gate electrodes 8 (electron multiplier sections 3b) are adjusted to a high potential of about 25 V, as shown in FIG. 9.

In a period F in FIG. 8, the transfer gate electrodes 9 are turned on and the transfer gate electrodes 10 are turned off, whereby the transfer channels 3 located under the transfer gate electrodes 9 are adjusted to a potential of about 4 V and the transfer channels 3 located under the transfer gate electrodes 10 are adjusted to a potential of about 1V, as shown in FIG. 9. Thus, the electrons stored in the transfer channels 3 located under the transfer gate electrodes 10 are transferred to the transfer channels 3 located under the transfer gate electrodes 9 adjusted to a potential (about 4 V) higher than the potential (about 1 V) of the transfer channels 3 located under the transfer gate electrodes 10. The electrons transferred to the transfer channels 3 located under the transfer gate electrodes 9 are transferred to the transfer channels 3 located under the multiplication gate electrodes 8 adjusted to the potential (about 25 V) higher than the potential (about 4 V) of the transfer channels 3 located under the transfer gate electrodes 9. The electrons transferred to the transfer channels 3 located under the multiplication gate electrodes 8 (electron multiplier sections 3b) obtain energy from high electric fields during movement in the boundaries between the transfer channels 3 located under the multiplication gate electrodes 8 and the transfer channels 3 located under the transfer gate electrodes 9. The electrons having high energy collide with silicon atoms to generate electrons and holes. Thereafter the electrons generated due to impact ionization are stored in the transfer channels 3 located under the multiplication gate electrodes 8 (electron multiplier sections 3b) due to the electric fields.

In a period G in FIG. 8, the transfer gate electrodes 9 are turned off, whereby the transfer channels 3 located under the transfer gate electrodes 9 are adjusted to a potential of about 1 V, as shown in FIG. 9.

The aforementioned transfer operation of electrons in the periods B and C in FIG. 7 is performed, whereby the electrons stored in the transfer channels 3 located under the multiplication gate electrodes 8 (electron multiplier sections (charge accumulation wells) 3b) are transferred to the transfer channels 3 located under the transfer gate electrodes 10 (electron storage portions (temporary storage wells) 3a). Thereafter the aforementioned multiplication operation in the periods E to G and the transfer operation in the periods B and C are repeatedly performed a plurality of times (about 400 times, for example), thereby multiplying the electrons transferred from the photodiode portions 4 by about 2000 times.

According to the first embodiment, as hereinabove described, the readout gate electrodes 11 are provided between the transfer gate electrodes 10 and the floating diffusion regions 5 and the multiplication gate electrodes 8 are provided on opposite sides to the readout gate electrodes 11 and the floating diffusion regions 5 with respect to the transfer gate electrodes 10, whereby the relatively low voltage (about 2.9 V) applied to the transfer gate electrodes 10 is changed without changing a high voltage (about 24 V) applied to the multiplication gate electrodes 8 for generating electric fields causing impact ionization of electrons when reading data. Thus, the electrons stored in the electron storage portions 3a can be transferred to the floating diffusion regions 5. Thus, the potential of the transfer channels 3 located under the readout gate electrodes 11 can be inhibited from changing due to change in the high potential (about 25 V) of the transfer channels 3 located under the multiplication gate electrodes 8 (electron multiplier sections 3b) when reading data, whereby variation in the number of the electrons transferred from the electron storage portions 3a to the floating diffusion regions 5 can be suppressed. Consequently, read of data can be correctly performed.

According to the first embodiment, the transfer gate electrodes 9 for transferring electrons are provided between the multiplication gate electrodes 8 and the transfer gate electrodes 10, the transfer gate electrodes 9 are turned on and the transfer gate electrodes 10 are turned off in a state where the transfer channels 3 located under the multiplication gate electrodes 8 (electron multiplier sections 3b) are adjusted to a high potential of about 25 V, and thereafter the transfer gate electrodes 9 are turned off, whereby the electrons stored in the electron storage portions 3a can be easily transferred to the electron multiplier sections 3b and multiplied.

According to the first embodiment, the transfer gate electrodes 9 are turned on and the multiplication gate electrodes 8 are turned off in a state where the electrons are stored in the transfer channels 3 located under the multiplication gate electrodes 8 (electron multiplier sections 3b), and thereafter the transfer gate electrodes 10 are turned on and the transfer gate electrodes 9 are turned off, whereby the electrons multiplied by the electron multiplier sections 3b can be transferred to and stored in the electron storage portions 3a.

According to the first embodiment, the multiplication by transfer of electrons from the electron storage portions 3a to the electron multiplier sections 3b and the transfer of electrons from the electron multiplier sections 3b to the electron storage portions 3a are alternately repeatedly performed, whereby the multiplication operation of electrons can be performed a plurality of times (about 400 times, for example) and hence the multiplication factor of electrons can be improved. Thus, the number of the electrons transferred from the photodiode portions 4 can be multiplied by about 2000 times.

Second Embodiment

According to a second embodiment, the potentials of transfer channels 3 located under transfer gate electrodes 7 and readout gate electrodes 11 are adjusted to a potential (higher potential barrier) lower than the potentials of transfer channels 3 under multiplication gate electrodes 8, transfer gate electrodes 9 and transfer gate electrodes 10 when OFF signals (low-level signals) of clock signals Φ1 and Φ5 are supplied to the transfer gate electrodes 7 and the readout gate electrodes 11 dissimilarly to the aforementioned first embodiment.

Figure 10:
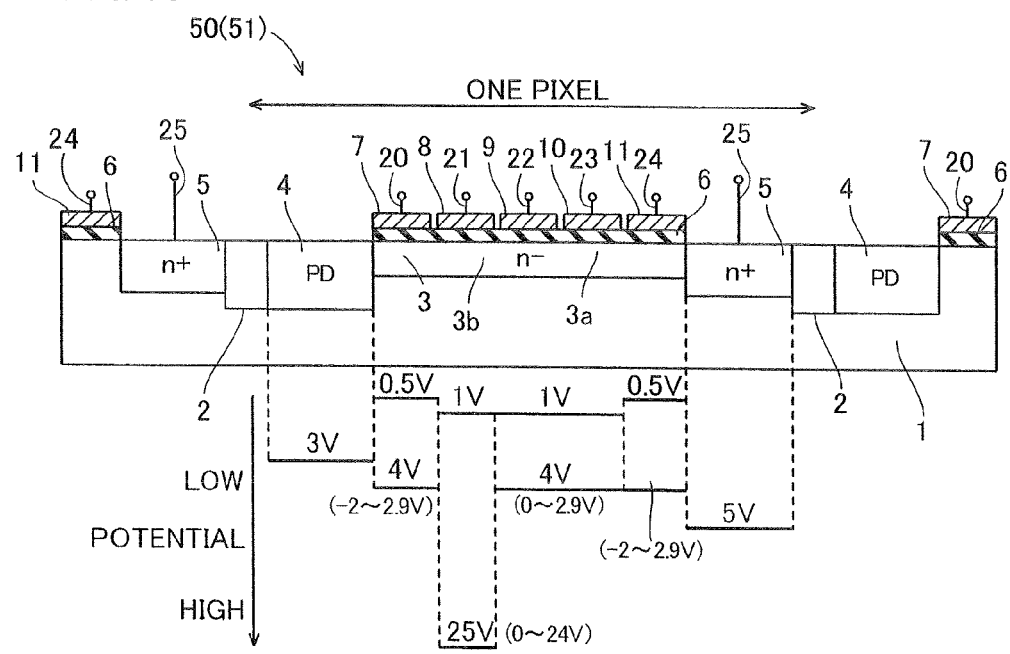
FIG. 10 is a sectional view showing a structure of a CMOS image sensor according to a second embodiment of the present invention.

According to the second embodiment, when OFF signals (low-level signals) of clock signals Φ2, Φ3 and Φ4 are supplied to the multiplication gate electrodes 8, the transfer gate electrodes 9 and the transfer gate electrodes 10 through wiring layers 21, 22 and 23 respectively, a voltage of about 0 V is applied to the multiplication gate electrodes 8, the transfer gate electrodes 9 and the transfer gate electrodes 10, as shown in FIG. 10. At this time, the transfer channels 3 located under the multiplication gate electrodes 8, the transfer gate electrodes 9 and the transfer gate electrodes 10 are adjusted to a potential of about 1 V. When OFF signals (low-level signals) of the clock signals Φ1 and Φ5 are supplied to the transfer gate electrodes 7 and the readout gate electrodes 11 through wiring layers 20 and 24 respectively, a voltage of about −2 V is applied to the transfer gate electrodes 7 and the readout gate electrodes 11. At this time, the transfer channels 3 located under the transfer gate electrodes 7 and the readout gate electrodes 11 are adjusted to a potential of about 0.5 V. The remaining structure of the second embodiment is similar to that of the first embodiment, and therefore the description thereof will not be repeated.

A transfer operation and a multiplication operation of electrons of a CMOS image sensor according to a second embodiment will be now described.

Figure 11:
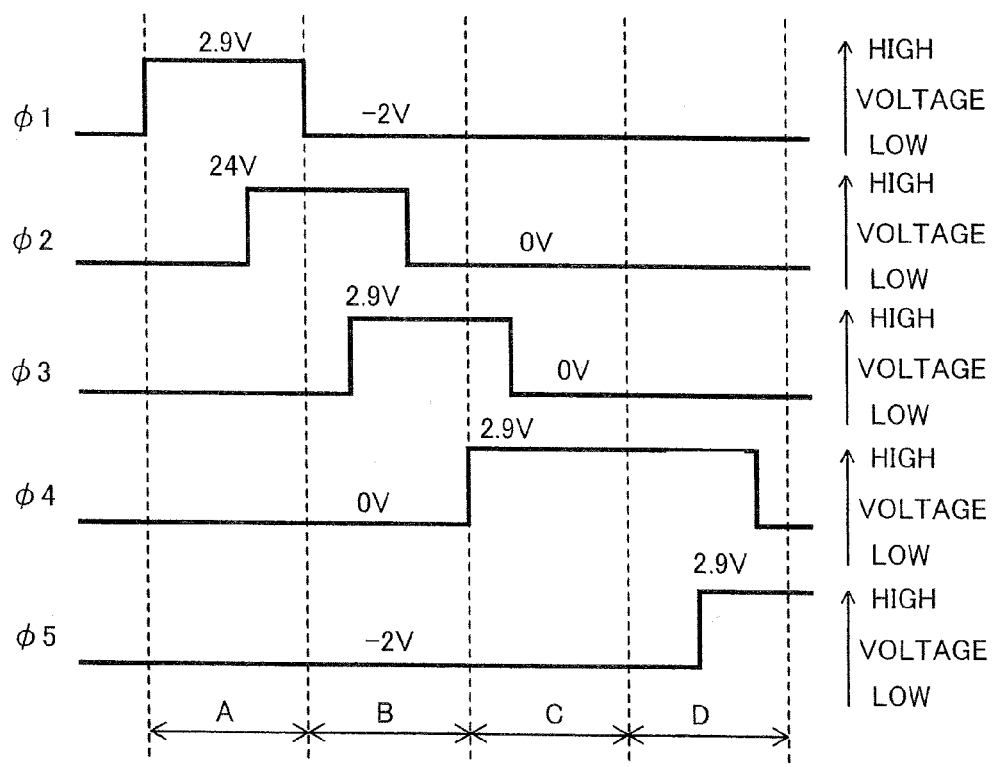
FIG. 11 is a signal waveform diagram for illustrating a transfer operation of the electrons in the CMOS image sensor according to the second embodiment of the present invention.
Figure 12:
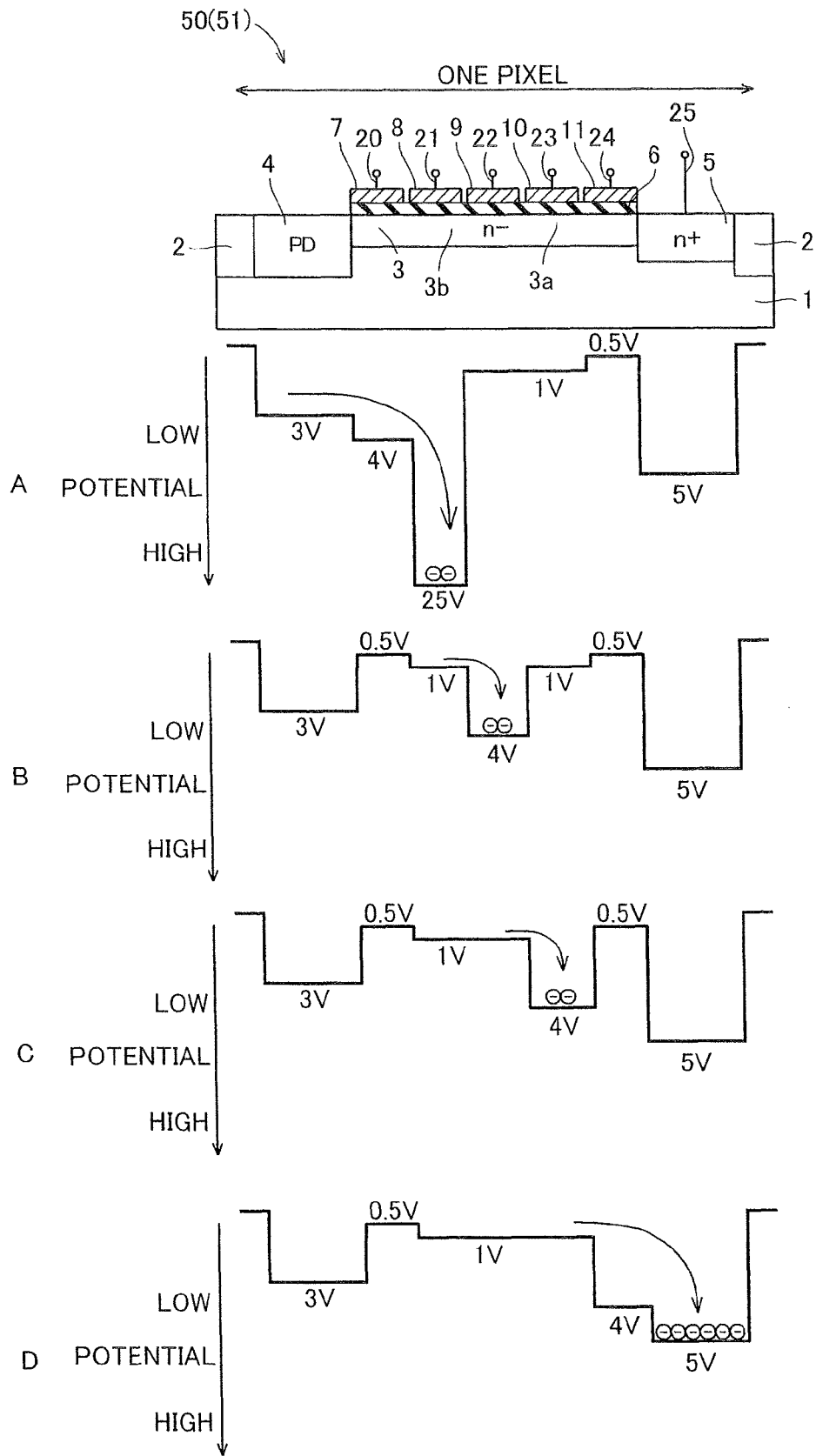
FIG. 12 is a potential diagram for illustrating a transfer operation of the electrons in the CMOS image sensor according to the second embodiment of the present invention.

First, in a period A in FIG. 11, the transfer gate electrodes 7 are turned on, whereby the transfer channels 3 located under the transfer gate electrodes 7 are adjusted to a potential of about 4 V, as shown in FIG. 12. Thus, electrons stored in the photodiode portions 4 adjusted to a potential of about 3 V are transferred from the photodiode portions 4 to the transfer channels 3 located under the transfer gate electrodes 7. Thereafter the multiplication gate electrodes 8 are turned on, whereby the transfer channels located under the multiplication gate electrodes 8 are adjusted to a potential of about 25 V. Thus, the electrons transferred to the transfer channels 3 located under the transfer gate electrodes 7 are transferred to the transfer channels 3 located under the multiplication gate electrodes 8. The transfer gate electrodes 7 are turned off, whereby the transfer channels 3 located under the transfer gate electrodes 7 are adjusted to a potential of about 0.5 V. At this point (at a point of end of the period A), difference between the potentials of the transfer channels 3 located under the transfer gate electrodes 7 and located under the readout gate electrodes 11 and the potentials of the transfer channels 3 located under the multiplication gate electrodes 8 are about 24.5 V, which is the largest difference in potential in the transfer channels 3.

In a period B in FIG. 11, the transfer gate electrodes 9 are turned on and the multiplication gate electrodes 8 are turned off, whereby the transfer channels 3 located under the transfer gate electrodes 9 are adjusted to a potential of about 4 V and the transfer channels 3 located under the multiplication gate electrodes 8 are adjusted to a potential of about 1 V, as shown in FIG. 12. Thus, the electrons stored in the transfer channels 3 located under the multiplication gate electrodes 8 are transferred to the transfer channels 3 located under the transfer gate electrodes 9.

In a period C in FIG. 11, the transfer gate electrodes 10 are turned on and the transfer gate electrodes 9 are turned off, whereby the transfer channels 3 located under the transfer gate electrodes 10 are adjusted to a potential of about 4 V and the transfer channels 3 located under the transfer gate electrodes 9 are adjusted to a potential of about 1 V, as shown in FIG. 12. Thus, the electrons transferred to the transfer channels 3 located under the transfer gate electrodes 9 are transferred to the transfer channels 3 located under the transfer gate electrodes 10. Thus, the electrons transferred from the photodiode portions 4 are temporarily stored in the transfer channels 3 located under the transfer gate electrodes 10 (electron storage portions (temporary storage wells) 3a). Thereafter the multiplication operation of electrons described later is repeatedly performed a plurality of times (about 400 times, for example). Thus, the electrons transferred from the photodiode portions 4 are multiplied by about 2000 times.

In a period D in FIG. 11, the readout gate electrodes 11 are turned on and the transfer gate electrodes 10 are turned off in a state where the electrons are temporarily stored in the transfer channels 3 located under the transfer gate electrodes 10 (electron storage portions 3a), whereby the transfer channels 3 located under the readout gate electrodes 11 are adjusted to a potential of about 4 V and the transfer channels 3 located under the transfer gate electrodes 10 are adjusted to a potential of about 1 V, as shown in FIG. 12. Thus, the electrons stored in the transfer channels 3 located under the transfer gate electrodes 10 (electron storage portions 3a) are transferred to the floating diffusion regions 5 adjusted to a potential of about 5 V through the transfer channels 3 located under the readout gate electrodes 11 adjusted to a potential of about 4 V. The potentials of the transfer channels 3 located under the transfer gate electrodes 7 and the transfer channels 3 located under the readout gate electrodes 11 are maintained at a potential of about 0.5 V until the readout gate electrodes 11 are turned on in order to transfer the electrons to the floating diffusion regions 5 in the period D from a point at which the electrons are transferred to the transfer channels 3 located under the multiplication gate electrodes 8 and the transfer gate electrodes 7 are turned off in the period A.

The multiplication operation of electrons of the CMOS image sensor will be now described.

Figure 13:
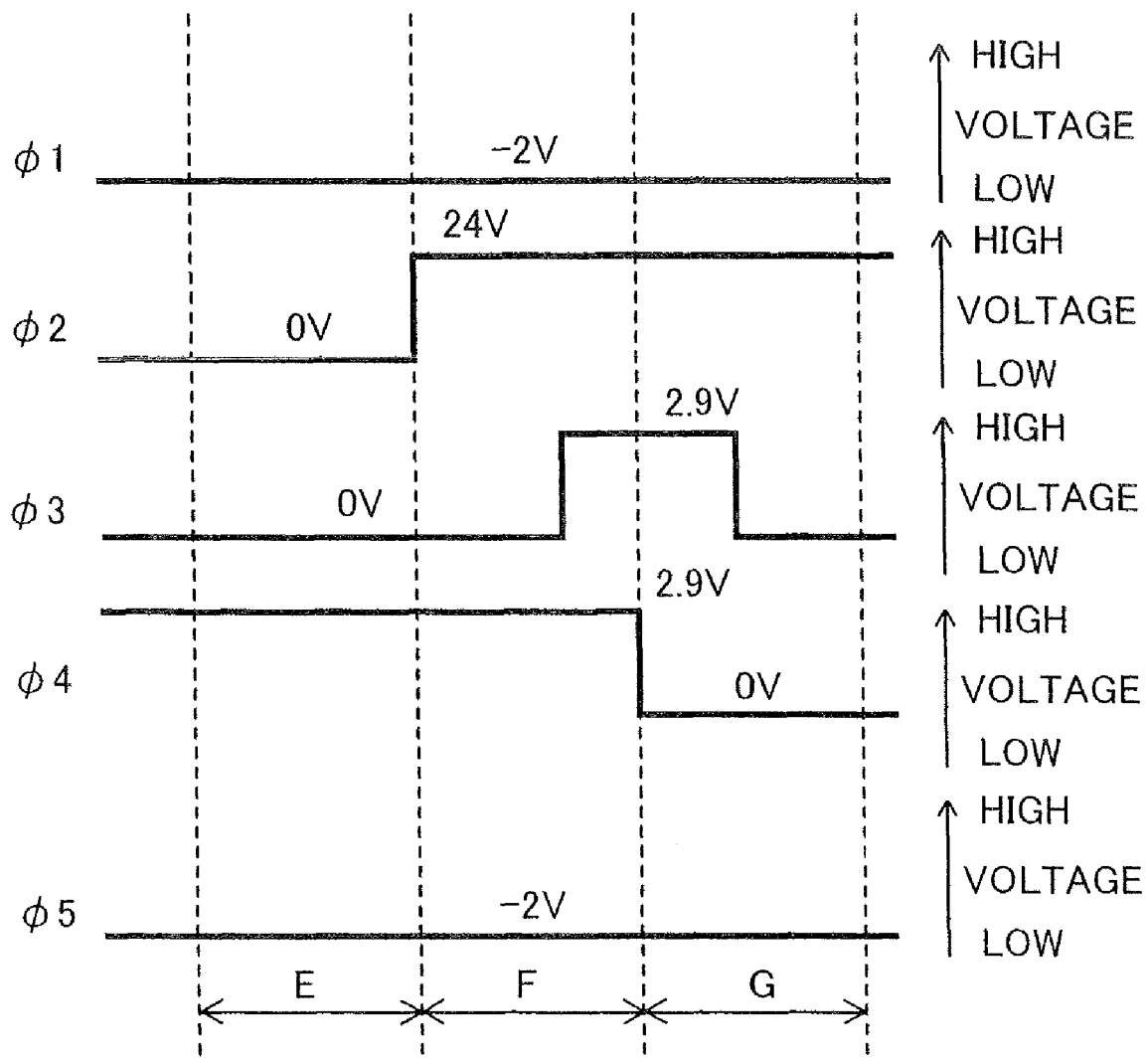
FIG. 13 is a signal waveform diagram for illustrating a multiplication operation of the electrons in the CMOS image sensor according to the second embodiment of the present invention.
Figure 14:
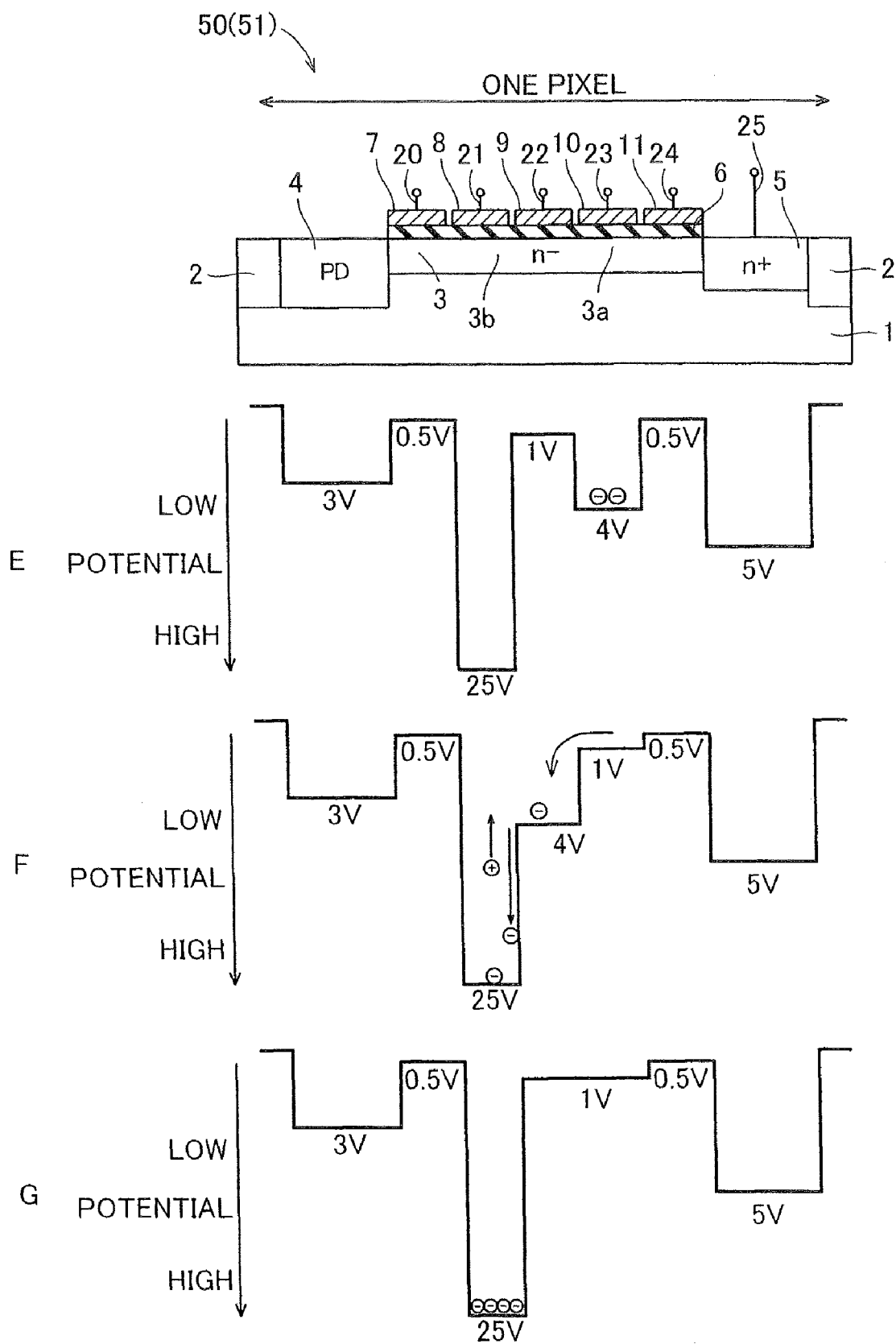
FIG. 14 is a potential diagram for illustrating the multiplication operation of the electrons in the CMOS image sensor according to the second embodiment of the present invention.

First, after the transfer operation in the period C in FIG. 11, in a period E in FIG. 13, the multiplication gate electrodes 8 are turned on in a case where the electrons are stored in the transfer channels 3 located under the transfer gate electrodes 10 (electron storage portions 3a), whereby the transfer channels 3 located under the multiplication gate electrodes 8 (electron multiplier sections 3b) are adjusted to a high potential of about 25 V, as shown in FIG. 14.

In a period F in FIG. 13, the transfer gate electrodes 9 are turned on and the transfer gate electrodes 10 are turned off, whereby the transfer channels 3 located under the transfer gate electrodes 9 are adjusted to a potential of about 4 V and the transfer channels 3 located under the transfer gate electrodes 10 are adjusted to a potential of about 1V, as shown in FIG. 14. Thus, the electrons stored in the transfer channels 3 located under the transfer gate electrodes 10 are transferred to the transfer channels 3 located under the transfer gate electrodes 9. The electrons transferred to the transfer channels 3 located under the transfer gate electrodes 9 are transferred to the transfer channels 3 located under the multiplication gate electrodes 8. The electrons transferred to the transfer channels 3 located under the multiplication gate electrodes 8 (electron multiplier sections 3b) collide with silicon atoms to generate electrons and holes similarly to the first embodiment and the electrons generated due to impact ionization are stored in the transfer channels 3 located under the multiplication gate electrodes 8 (electron multiplier sections 3b) by electric fields.

In a period G in FIG. 13, the transfer gate electrodes 9 are turned off, whereby the transfer channels 3 located under the transfer gate electrodes 9 are adjusted to a potential of about 1 V, as shown in FIG. 14.

The aforementioned transfer operation of electrons in the periods B and C in FIG. 11 is performed, whereby the electrons stored in the transfer channels 3 located under the multiplication gate electrodes 8 (electron multiplier sections 3b) are transferred to the transfer channels 3 located under the transfer gate electrodes 10 (electron storage portions 3a). Thereafter the aforementioned multiplication operation in the periods E to G and the transfer operation in the periods B and C are repeatedly performed a plurality of times (about 400 times, for example), thereby multiplying the electrons transferred from the photodiode portions 4 by about 2000 times.

As hereinabove described, the potentials of the transfer channels 3 located under the transfer gate electrodes 7 and the transfer channel 3 located under the readout gate electrode 11 are maintained at a potential of about 0.5 V until the electrons are transferred to and stored in the transfer channels 3 located under the multiplication gate electrodes 8 (electron multiplier sections 3b) in the period G from a state where the electrons are stored in the transfer channels 3 located under the transfer gate electrodes 10 (electron storage portions 3a) in the period E. In other words, according to the second embodiment, the potentials of the transfer channels 3 located under the transfer gate electrodes 7 and the transfer channels 3 located under the readout gate electrodes 11 are so controlled as to be lower than the potentials of the transfer channels 3 located under the multiplication gate electrodes 8, the transfer channels 3 located under the transfer gate electrodes 9 and the transfer channels 3 located under the transfer gate electrodes 10 in the transfer operation of electrons from the transfer channels 3 located under the transfer gate electrodes 10 (electron storage portions 3a) to the transfer channels 3 located under the multiplication gate electrodes 8 (electron multiplier sections 3b) and in the transfer operation of electrons from the transfer channels 3 located under the multiplication gate electrodes 8 (electron multiplier sections 3b) to the transfer channels 3 located under the transfer gate electrodes 10 (electron storage portions 3a).

According to the second embodiment, as hereinabove described, the readout gate electrodes 11 are provided between the transfer gate electrodes 10 and the floating diffusion regions 5 and the multiplication gate electrodes 8 are provided on sides opposite to the readout gate electrodes 11 and the floating diffusion regions 5 with respect to the transfer gate electrodes 10, whereby the relatively low voltage (about 2.9 V) applied to the transfer gate electrodes 10 is changed without changing a high voltage (about 24 V) applied to the multiplication gate electrodes 8 for generating electric fields causing impact ionization of electrons when reading data. Thus, the electrons stored in the electron storage portions 3a can be transferred to the floating diffusion regions 5. Thus, the potential of the transfer channels 3 located under the readout gate electrodes 11 can be inhibited from changing due to change in the high potential (about 25 V) of the transfer channels 3 located under the multiplication gate electrodes 8 (electron multiplier sections 3b) when reading data, whereby variation in the number of the electrons transferred from the electron storage portions 3a to the floating diffusion regions 5 can be suppressed. Consequently, read of data can be correctly performed.

According to the second embodiment, in the transfer operation of electrons from the transfer channels 3 located under the transfer gate electrodes 10 (electron storage portions 3a) to the transfer channels 3 located under the multiplication gate electrodes 8 (electron multiplier sections 3b), and in the transfer operation of electrons from the transfer channels 3 located under the multiplication gate electrodes 8 (electron multiplier sections 3b) to the transfer channels 3 located under the transfer gate electrodes 10 (electron storage portions 3a), the potentials of the transfer channels 3 located under the transfer gate electrodes 7 and the transfer channels 3 located under the readout gate electrodes 11 are so controlled as to be lower than the potentials of the transfer channels 3 located under the multiplication gate electrodes 8, the transfer channels 3 located under the transfer gate electrodes 9 and the transfer channels 3 located under the transfer gate electrodes 10, whereby the potentials of the transfer channels 3 located under the transfer gate electrodes 7 and the readout gate electrodes 11 are made lower than the potentials of the transfer channels 3 located under the multiplication gate electrodes 8, the transfer gate electrodes 9 and the transfer gate electrodes 10. In other words, the potentials of the transfer channels 3 located under the transfer gate electrodes 7 and the readout gate electrodes 11 are higher than the potentials of the transfer channels 3 located under the multiplication gate electrodes 8, the transfer gate electrodes 9 and the transfer gate electrodes 10, whereby barrier (charge barrier) height with respect to movement of electrons is increased. Therefore, electrons can be inhibited from being leaked into the photodiode portions 4 or the floating diffusion regions 5 over the charge barriers generated in the transfer channels 3 located under the transfer gate electrodes 7 and the readout gate electrodes 11 in the transfer operation of electrons from the transfer channels 3 located under the transfer gate electrodes 10 (electron storage portions 3a) to the transfer channels 3 located under the multiplication gate electrodes 8 (electron multiplier sections 3b) and in the transfer operation of electrons from the transfer channels 3 located under the multiplication gate electrodes 8 (electron multiplier sections 3b) to the transfer channels 3 located under the transfer gate electrodes 10 (electron storage portions 3a). Thus, variation in the number of the electrons transferred from the electron storage portions 3a to the floating diffusion regions 5 can be reliably suppressed. Consequently, read of data can be correctly performed.

The remaining operation and effects of the second embodiment are similar to those of the aforementioned first embodiment.

Third Embodiment

According to a third embodiment, when OFF signals (low-level signals) of clock signals Φ1 and Φ5 are supplied to transfer gate electrodes 7 and readout gate electrodes 11, the potentials of transfer channels 3 located under the transfer gate electrodes 7 and the readout gate electrodes 11 are adjusted to different potentials (higher potential barriers) lower than the transfer channels 3 located under the potentials of multiplication gate electrodes 8, transfer gate electrodes 9 and transfer gate electrodes 10 dissimilarly to the aforementioned second embodiment.

Figure 15:
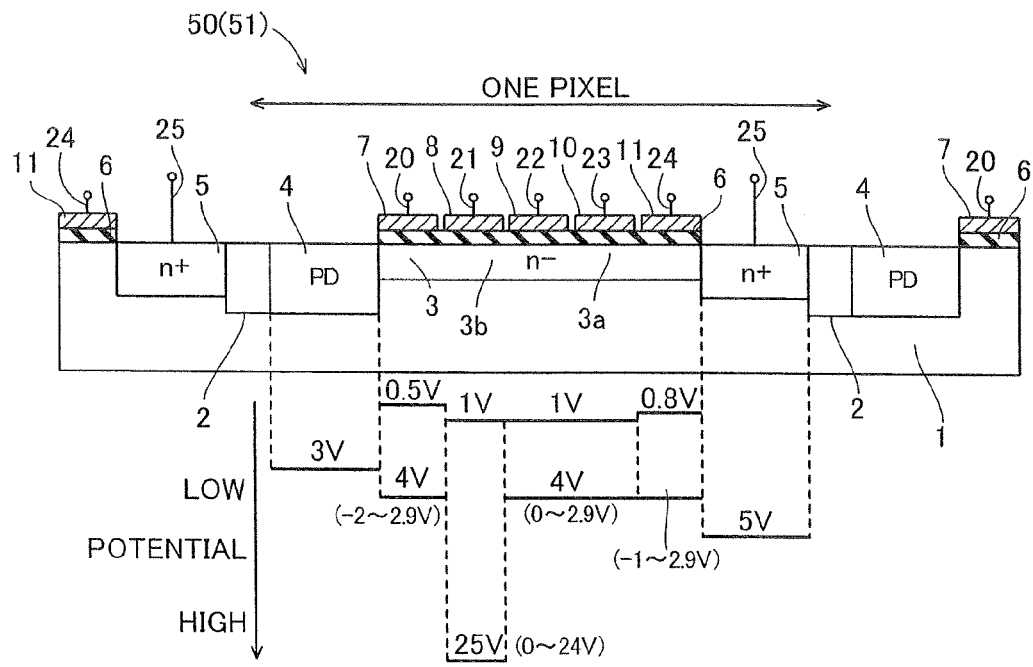
FIG. 15 is a sectional view showing a structure of a CMOS image sensor according to a third embodiment of the present invention.

According to the third embodiment, when OFF signals (low-level signals) of clock signals Φ2, Φ3 and Φ4 are supplied to the multiplication gate electrodes 8, the transfer gate electrodes 9 and the transfer gate electrodes 10 through wiring layers 21, 22 and 23 respectively, a voltage of about 0 V is applied to the multiplication gate electrodes 8, the transfer gate electrodes 9 and the transfer gate electrodes 10, as shown in FIG. 15. At this time, the transfer channels 3 located under the multiplication gate electrodes 8, the transfer gate electrodes 9 and the transfer gate electrodes 10 are adjusted to a potential of about 1 V. When OFF signals (low-level signals) of the clock signals Φ1 and Φ5 are supplied to the transfer gate electrodes 7 and the readout gate electrodes 11 through wiring layers 20 and 24 respectively, voltages of about −2 V and about −1 V are applied to the transfer gate electrodes 7 and the readout gate electrodes 11 respectively. At this time, the transfer channels 3 located under the transfer gate electrodes 7 and the transfer channels 3 located under the readout gate electrodes 11 are adjusted to potentials of about 0.5 V and about 0.8 V respectively. The remaining structure and operation of the third embodiment is similar to those of the first embodiment.

According to the third embodiment, as hereinabove described, in a transfer operation of electrons from the transfer channels 3 located under the transfer gate electrodes 10 (electron storage portions 3a) to the transfer channels 3 located under the multiplication gate electrodes 8 (electron multiplier sections 3b), and in a transfer operation of electrons from the transfer channels 3 located under the multiplication gate electrodes 8 (electron multiplier sections 3b) to the transfer channels 3 located under the transfer gate electrodes 10 (electron storage portions 3a), the potentials of the transfer channels 3 located under the transfer gate electrodes 7 and the transfer channels 3 located under the readout gate electrodes 11 are so controlled as to be lower than the potentials of the transfer channels 3 located under the multiplication gate electrodes 8, the transfer channels 3 located under the transfer gate electrodes 9 and the transfer channels 3 located under the transfer gate electrodes 10 and the potential of the transfer channels 3 located under the transfer gate electrodes 7 are so controlled as to be lower than the potential of the transfer channels 3 located under the readout gate electrodes 11, whereby the potential of the transfer channels 3 located under the transfer gate electrodes 7 located adjacent to the electron multiplier sections 3b are the highest (charge barriers are the highest). Thus, electrons can be inhibited from being leaked into the photodiode portions 4 over the charge barriers generated in the transfer channels 3 located under the transfer gate electrodes 7 in the transfer operation of electrons from the transfer channels 3 located under the transfer gate electrodes 10 (electron storage portions 3a) to the transfer channels 3 located under the multiplication gate electrodes 8 (electron multiplier sections 3b) and in the transfer operation of electrons from the transfer channels 3 located under the multiplication gate electrodes 8 (electron multiplier sections 3b) to the transfer channels 3 located under the transfer gate electrodes 10 (electron storage portions 3a). The potential of the transfer channels 3 located under the readout gate electrodes 11 is also lower than the potentials of the transfer channels 3 located under the multiplication gate electrodes 8, the transfer channels 3 located under the transfer gate electrodes 9 and the transfer channels 3 located under the transfer gate electrodes 10, and therefore electrons can be inhibited from being leaked into the floating diffusion regions 5 over the charge barriers generated in the transfer channels 3 located under the readout gate electrodes 11.

The remaining effects of the third embodiment are similar to that of the aforementioned first embodiment.

Fourth Embodiment

According to a fourth embodiment, transfer gate electrodes 7 are further formed such that the gate lengths of the transfer gate electrodes 7 are larger as compared with the gate lengths of other gate electrodes in the structure of the aforementioned second embodiment.

Figure 16:
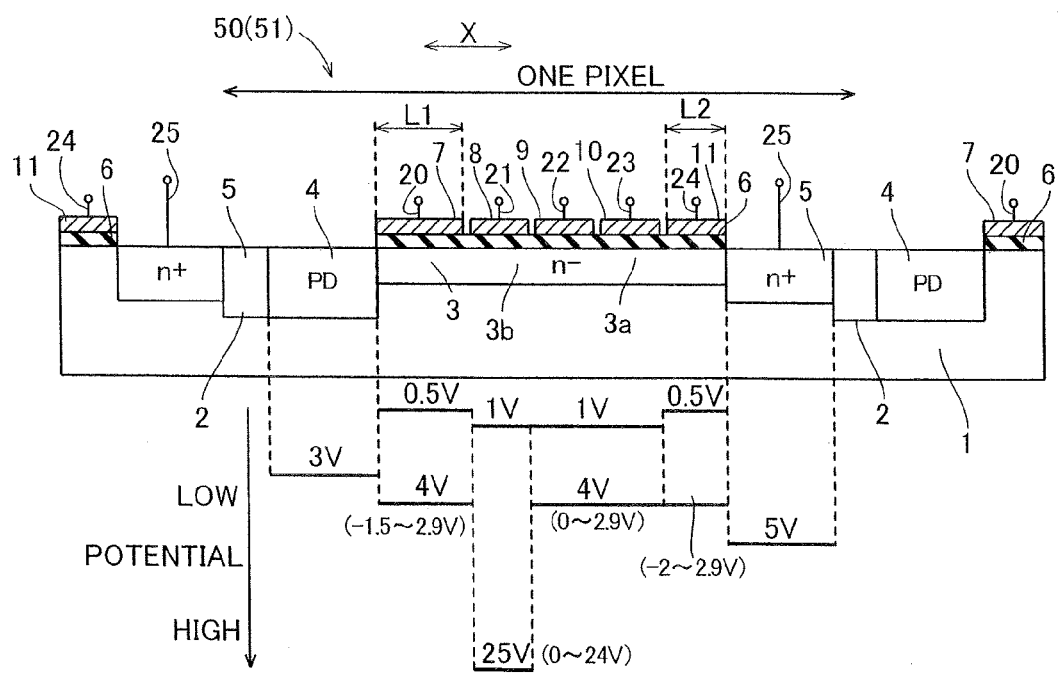
FIG. 16 is a sectional view showing a structure of a CMOS image sensor according to a fourth embodiment of the present invention.
Figure 17:
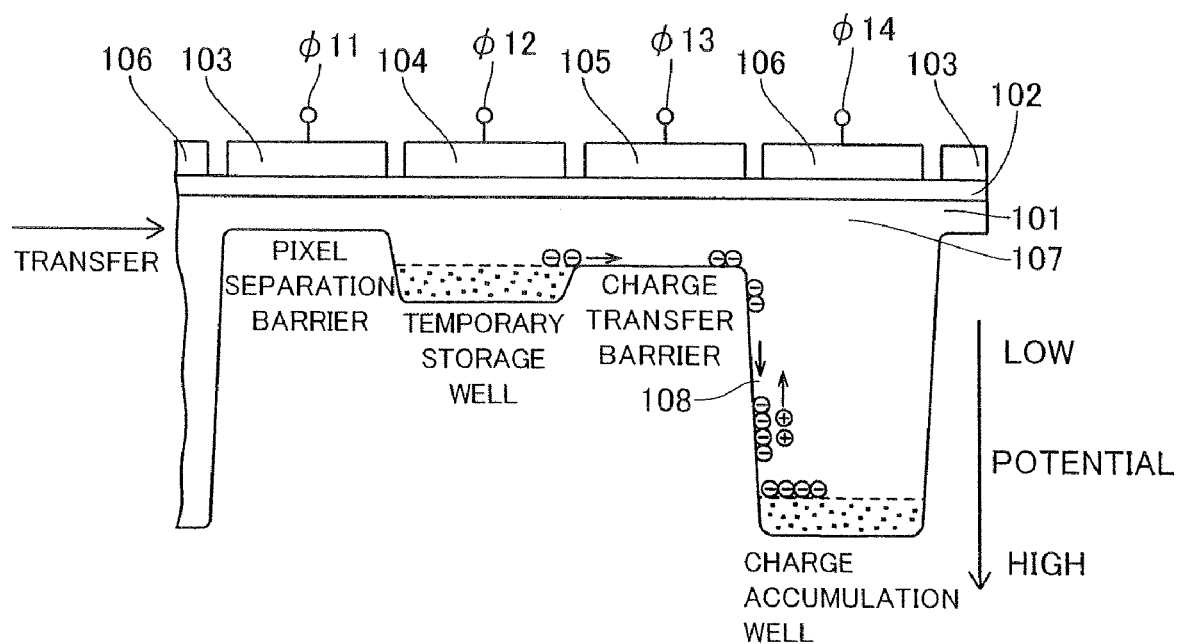
FIG. 17 is a sectional view showing a structure of the conventional CCD image sensor.

According to the fourth embodiment, as shown in FIG. 16, the gate length of each transfer gate electrode 7 (L1 in FIG. 16) is larger than the lengths of the gate electrodes other than the transfer gate electrode 7 (L2 in FIG. 16). According to the fourth embodiment, when OFF signals (low-level signals) of clock signals $\Phi 1$ and $\Phi 5$ are supplied to the transfer gate electrodes 7 and the readout gate electrodes 11 through wirings 20 and 24 respectively, voltages of about −1.5 V and about −2 V are applied to the transfer gate electrodes 7 and the readout gate electrodes 11 respectively. At this time, transfer channels 3 located under the transfer gate electrodes 7 and the readout gate electrodes 11 are adjusted to a potential of about 0.5 V. The remaining structure and operation of the fourth embodiment are similar to those of the first embodiment.

According to the fourth embodiment, as hereinabove described, the gate length of each transfer gate electrode 7 (L1 in FIG. 16) is larger than the gate lengths of the gate electrodes other than the transfer gate electrode 7 (L2 in FIG. 16), whereby the length of barrier (charge barrier) (length along arrow X in FIG. 16) generated by the potential of the transfer channel 3 located under each transfer gate electrode 7 is also increased in proportion to the gate length of each transfer gate electrode 7. Therefore, electrons can be further reliably inhibited from being leaked into the photodiode portions 4 over the barriers (charge barriers) generated in the transfer channels 3 located under the transfer gate electrodes 7 in the transfer operation of electrons from the transfer channels 3 located under the transfer gate electrodes 10 (electron storage portions 3a) to the transfer channels 3 located under the multiplication gate electrodes 8 (electron multiplier sections 3b) and in the transfer operation of electrons from the transfer channels 3 located under the multiplication gate electrodes 8 (electron multiplier sections 3b) to the transfer channels 3 located under the transfer gate electrodes 10 (electron storage portions 3a), as compared with the aforementioned second embodiment. Thus, variation in the number of the electrons transferred from the electron storage portions 3a to the floating diffusion regions 5 can be reliably suppressed. Consequently, read of data can be correctly performed.

The remaining effects of the forth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned first to fourth embodiments is applied to the passive CMOS image sensor, which does not amplify charge signals in each pixel 50 employed as an exemplary imaging device, the present invention is not restricted to this but is also applicable to an active CMOS image sensor which amplifies signal charges in each pixel.

While the one reset gate transistor 26 is formed for the plurality of pixels 50 in each column in each of the aforementioned first to fourth embodiments, the present invention is not restricted to this but the one reset gate transistor may be alternatively formed for each one pixel.

While after the transfer gate electrodes 9 are turned off in the period G, the transfer gate electrodes 9 are turned on and the multiplication gate electrodes 8 are turned off in the period B so that the electrons stored in the electron multiplier sections 3b are transferred to the transfer channels 3 located under the transfer gate electrodes 9 in each of the aforementioned first to fourth embodiments, the present invention is not restricted to this but the transfer gate electrodes 9 may be maintained in the ON-state after the multiplication of the electrons and the multiplication gate electrodes 8 may be turned off so that the electrons stored in the electron multiplier sections 3b are transferred to the transfer channels 3 located under the transfer gate electrodes 9.

While the transfer channels 3 located under the transfer gate electrodes 7, 9 and 10 and the readout gate electrodes 11 are adjusted to a potential of about 4 V when the transfer gate electrodes 7, 9 and 10 and the readout gate electrodes 11 are turned on in each of the aforementioned first to fourth embodiments, the present invention is not restricted to this but the transfer channels 3 located under the transfer gate electrodes 7, 9 and 10 and the readout gate electrodes 11 may be adjusted to different potentials when the transfer gate electrodes 7, 9 and 10 and the readout gate electrodes 11 are turned on.

While the readout gate electrodes 11 are turned on and the transfer gate electrodes 10 are turned off so that the electrons stored in the transfer channels 3 located under the transfer gate electrodes 10 (electron storage portions 3a) are transferred to the floating diffusion regions 5 adjusted to the potential of about 5 V higher than the potential (about 1 V) of the transfer channels 3 located under the transfer gate electrodes 10 through the transfer channels 3 located under the readout gate electrodes 11 adjusted to the potential of about 4 V in each of the aforementioned first to fourth embodiments, the present invention is not restricted to this but the readout gate electrodes 11 may be turned on and the transfer gate electrodes 10 may be maintained in the ON state so that the electrons stored in the transfer channels 3 located under the transfer gate electrodes 10 (electron storage portions 3a) are transferred to the floating diffusion regions 5 adjusted to the potential of about 5 V higher than the potential (about 4 V) of the transfer channels 3 located under the transfer gate electrodes 10 and the readout gate electrodes 11.

While the transfer channels 3, the photodiode portions 4 and the floating diffusion regions 5 are formed on the surface of the p-type silicon substrate 1 in each of the aforementioned first to fourth embodiments, the present invention is not restricted to this but a p-type well region may be formed on a surface of an n-type silicon substrate and the photodiode portions and the floating diffusion regions may be formed on a surface of the p-type well region.

While electrons are employed as signal charges in each of the aforementioned first to fourth embodiments, the present invention is not restricted to this but holes may be alternatively employed as signal charges by making a conductive type of a substrate impurity and a polarity of an applied voltage opposite.

While the potential of the transfer channels 3 located under the transfer gate electrodes 7 are so controlled as to be lower than the potential of the transfer channels 3 located under the readout gate electrodes 11 when the transfer gate electrodes 7 and the readout gate electrodes 11 are turned off in the aforementioned third embodiment, the present invention is not restricted to this but the potential of the transfer channels 3 located under the readout gate electrodes 11 may be so controlled as to be lower than the potential of the transfer channels 3 located under the transfer gate electrodes 7.

While the gate length of each transfer gate electrode 7 is larger than the gate lengths of the gate electrodes other than the transfer gate electrode 7 in the aforementioned fourth embodiment, the present invention is not restricted to this but the gate length of each readout gate electrode 11 may be alternatively larger than the gate length of the gate electrodes other than the readout gate electrode 11. Alternatively, both gate lengths of each transfer gate electrode 7 and each readout gate electrode 11 may be larger than the gate lengths of the gate electrodes other than the transfer gate electrode 7 and the readout gate electrode 11. In this case, larger gate length of each transfer gate electrode 7 arranged in the vicinity of the electron multiplier section 3b of the transfer channel 3 more effectively suppresses the leak of electrons.

What is claimed is:

1. An imaging device comprising:
   a storage portion for storing and transferring signal charges;
   a first electrode for generating an electric field storing the signal charges in said storage portion;
   a charge multiplication section for multiplying the signal charges stored in said storage portion due to impact ionization;
   a second electrode for generating the electric field for impact ionizing the signal charges in said charge multiplication section;
   a voltage conversion portion for converting the signal charges into a voltage;
   a third electrode for transferring the signal charges from said storage portion to said voltage conversion portion, provided between said first electrode and said voltage conversion portion, wherein
   said second electrode is provided on a side opposite to said third electrode and said voltage conversion portion with respect to said first electrode;
   a photoelectric conversion portion generating the signal charges; and
   a fourth electrode provided between said photoelectric conversion portion and said second electrode, wherein
   said fourth electrode, said second electrode, said charge multiplication section, said first electrode, said storage portion, said third electrode and said voltage conversion portion are included in one pixel.

2. The imaging device according to claim 1, further comprising a fifth electrode for transferring the signal charges, provided between said second electrode and said first electrode, wherein
   said first electrode and said fifth electrode are controlled such that the signal charges stored in said storage portion are transferred to said charge multiplication section in a state of generating the electric field for impact ionizing the signal charges with said second electrode.

3. The imaging device according to claim 2, wherein
   when the signal charges stored in said storage portion are transferred to said charge multiplication section, said second electrode is controlled such that a prescribed signal for turning on said second electrode is continued to be supplied to said second electrode and said first electrode and said fifth electrode are controlled such that a prescribed signal for turning off said first electrode is supplied to said first electrode after a prescribed signal for turning on said fifth electrode is supplied to said fourth electrode.

4. The imaging device according to claim 2, wherein
   said second electrode, said fifth electrode and said first electrode are controlled such that the signal charges multiplied with said charge multiplication section are transferred to said storage portion.

5. The imaging device according to claim 4, wherein
   when the signal charges multiplied with said charge multiplication section are transferred to said storage portion, said first electrode and said fifth electrode are controlled such that said first electrode is turned on and then said fifth electrode is turned off after said fifth electrode and said second electrode are controlled such that said fifth electrode is turned on and then said second electrode is turned off.

6. The imaging device according to claim 4, wherein
   multiplication by transfer of the signal charges from said storage portion to said charge multiplication section and transfer of the signal charges from said charge multiplication section to said storage portion are alternately repeatedly performed.

7. The imaging device according to claim 1, wherein said imaging device is a CMOS image sensor.

8. The imaging device according to claim 1, wherein
   said storage portion and said charge multiplication section are provided in a signal charge transfer region, and
   said fourth electrode, said second electrode, said fifth electrode, said first electrode and said third electrode are turned on and off so that the signal charges are transferred in said signal charge transfer region.

9. The imaging device according to claim 8, wherein
   said fourth electrode is so controlled as to be turned on when the signal charges generated with said photoelectric conversion portion are transferred from said photoelectric conversion portion to said signal charge transfer region.

10. The imaging device according to claim 8, wherein
    said third electrode is so controlled as to be turned on when the signal charges in said signal charge transfer region are transferred from said signal charge transfer region to said voltage conversion portion.

11. The imaging device according to claim 1, further comprising:
    a fifth electrode for transferring the signal charges, provided between said second electrode and said first electrode;
    wherein
    transfer channels are provided under said fourth electrode, said second electrode, said fifth electrode, said first electrode and said third electrode respectively, and
    at least one of the potentials of said transfer channel corresponding to said fourth electrode and said transfer channel corresponding to said third electrode is so controlled as to be lower than the potential of said transfer channel corresponding to said fifth electrode in a transfer operation of the signal charges from said storage portion to said charge multiplication section and in a transfer operation of the signal charges from said charge multiplication section to said storage portion.

12. The imaging device according to claim 11, wherein both the potential of said transfer channel corresponding to said fourth electrode and the potential of said transfer channel corresponding to said third electrode are so controlled as to be lower than the potential of said transfer channel corresponding to said fifth electrode in the transfer operation of the signal charges from said storage portion to said charge multiplication section and in the transfer operation of the signal charges from said charge multiplication section to said storage portion.

13. The imaging device according to claim 12, wherein the potential of said transfer channel corresponding to said fourth electrode and the potential of said transfer channel corresponding to said third electrode are so controlled as to be the same potential in the transfer operation of the signal charges from said storage portion to said charge multiplication section and in the transfer operation of the signal charges from said charge multiplication section to said storage portion.

14. The imaging device according to claim 11, wherein said fifth electrode is so arranged as to be adjacent to said second electrode, and
the potential of said transfer channel corresponding to said fourth electrode is so controlled as to be lower than the potential of said transfer channel corresponding to said third electrode in the transfer operation of the signal charges from said storage portion to said charge multiplication section and in the transfer operation of the signal charges from said charge multiplication section to said storage portion.

15. The imaging device according to claim 1, wherein
the length in a transfer direction of the signal charges of at least one of said fourth electrode and said third electrode is larger than the lengths in the transfer direction of the signal charges of all electrodes other than said at least one of said fourth electrode and said third electrode.

16. The imaging device according to claim 15, wherein the length in the transfer direction of the signal charges of said fourth electrode is larger than the lengths in the transfer direction of the signal charges of all electrodes other than said fourth electrode.

17. An imaging device comprising:
storage means for storing and transferring the signal charges;
a first electrode for generating an electric field storing the signal charges in said storage means;
charge multiplication means for multiplying the signal charges stored in said storage means due to impact ionization;
a second electrode for generating the electric field for impact ionizing the signal charges in said charge multiplication means;
voltage conversion means for converting the signal charges into a voltage;
a third electrode for transferring the signal charges from said storage means to said voltage conversion means, provided between said first electrode and said voltage conversion means, wherein
said second electrode is provided on a side opposite to said third electrode and said voltage conversion means with respect to said first electrode;
a photoelectric conversion portion generating the signal charges; and
a fourth electrode provided between said photoelectric conversion portion and said second electrode, wherein
said fourth electrode, said second electrode, said charge multiplication section, said first electrode, said storage portion, said third electrode and said voltage conversion portion are included in one pixel.

* * * * *